United States Patent
Takahashi et al.

(10) Patent No.: US 12,032,189 B2
(45) Date of Patent: Jul. 9, 2024

(54) PHASE DIFFERENCE FILM, CIRCULARLY POLARIZING PLATE, AND DISPLAY DEVICE

(71) Applicant: FUJIFILM Corporation, Tokyo (JP)

(72) Inventors: Yuta Takahashi, Kanagawa (JP); Yusuke Furuki, Kanagawa (JP); Hiroki Kuwahara, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/511,449

(22) Filed: Nov. 16, 2023

(65) Prior Publication Data

US 2024/0118474 A1    Apr. 11, 2024

Related U.S. Application Data

(63) Continuation of application No. PCT/JP2022/020710, filed on May 18, 2022.

(30) Foreign Application Priority Data

Jun. 1, 2021  (JP) .................................. 2021-092451

(51) Int. Cl.
*G02F 1/1335* (2006.01)
*G02B 5/30* (2006.01)
*G02F 1/13363* (2006.01)

(52) U.S. Cl.
CPC ..... *G02B 5/3016* (2013.01); *G02F 1/133635* (2021.01); *G02F 1/133636* (2013.01); *G02F 1/133541* (2021.01)

(58) Field of Classification Search
CPC ............. G02F 1/1335; G02F 1/133528; G02F 1/133541; G02F 1/1336; G02F 1/13363;

(Continued)

(56) References Cited

U.S. PATENT DOCUMENTS

2014/0284583 A1   9/2014   Saitoh et al.
2017/0192145 A1   7/2017   Furuki et al.
(Continued)

FOREIGN PATENT DOCUMENTS

JP          5960743 B2     8/2016
WO      2016/052360 A1    4/2016
(Continued)

OTHER PUBLICATIONS

International Search Report issued in PCT/JP2022/020710 on Aug. 9, 2022.

(Continued)

*Primary Examiner* — Thoi V Duong
(74) *Attorney, Agent, or Firm* — Edwards Neils LLC; Jean C. Edwards, Esq.

(57) ABSTRACT

A phase difference film includes a small change in tint when the film is applied to a display device as a circularly polarizing plate in combination with a polarizer display device being observed from an oblique direction at all azimuthal angles. The film includes optically anisotropic layers X, Y, and Z in this order, in which layer X is an A-plate, and layers Y and Z are formed by fixing a first and second liquid crystal compound, respectively, twist-aligned along a helical axis extending in a thickness direction, one of the first and second liquid crystal compounds are rod-like liquid crystal compounds, the other first and the second liquid crystal compounds are disk-like liquid crystal compounds, and an in-plane slow axis of layer X is parallel to an in-plane slow axis on a surface of layer Y on layer X side.

17 Claims, 8 Drawing Sheets

(58) Field of Classification Search
CPC ......... G02F 1/133635; G02F 1/133636; G02B 5/30; G02B 5/3016; G09F 9/00; H05B 33/02; H10K 50/00; H10K 59/00
See application file for complete search history.

(56)  References Cited

U.S. PATENT DOCUMENTS

| | | | |
|---|---|---|---|
| 2017/0351147 A1* | 12/2017 | Akutagawa | ......... G02F 1/13363 |
| 2019/0353957 A1 | 11/2019 | Atsumi et al. | |
| 2022/0206203 A1 | 6/2022 | Yanokuchi et al. | |

FOREIGN PATENT DOCUMENTS

| | | |
|---|---|---|
| WO | 2018/164126 A1 | 9/2018 |
| WO | 2020/209354 A1 | 10/2020 |
| WO | 2021/060378 A1 | 4/2021 |

OTHER PUBLICATIONS

Written Opinion issued in PCT/JP2022/020710 on Aug. 9, 2022.
International Preliminary Report on Patentability completed by WIPO on Nov. 21, 2023 in connection with International Patent Application No. PCT/JP2022/020710.

* cited by examiner

PHASE DIFFERENCE FILM, CIRCULARLY POLARIZING PLATE, AND DISPLAY DEVICE

CROSS-REFERENCE TO RELATED APPLICATIONS

This application is a Continuation of PCT International Application No. PCT/JP2022/020710 filed on May 18, 2022, which was published under PCT Article 21(2) in Japanese, and which claims priority under 35 U.S.C. § 119(a) to Japanese Patent Application No. 2021-092451 filed on Jun. 1, 2021. The above applications are hereby expressly incorporated by reference, in their entirety, into the present application.

BACKGROUND OF THE INVENTION

1. Field of the Invention

The present invention relates to a phase difference film, a circularly polarizing plate, and a display device.

2. Description of the Related Art

A phase difference film having refractive index anisotropy is applied to various applications such as an antireflection film of a display device and an optical compensation film of a liquid crystal display device.

For example, JP5960743B discloses a phase difference plate in which two types of optically anisotropic layers exhibiting predetermined optical properties are laminated.

SUMMARY OF THE INVENTION

The present inventors have found that, in a case where an optical film described in JP5960743B on which an optically anisotropic layer is laminated is combined with a polarizer and then applied as a circularly polarizing plate to a display device, and the display device is observed from an oblique direction at all azimuthal angles, there is a large change in tint and therefore there is room for improvement.

The present invention has been made in view of the above-mentioned circumstances, and an object of the present invention is to provide a phase difference film that has a small change in tint in a case where the phase difference film is applied to a display device as a circularly polarizing plate in combination with a polarizer, and the display device is observed from an oblique direction at all azimuthal angles.

Another object of the present invention is to provide a circularly polarizing plate and a display device.

As a result of extensive studies on the problems of the related art, the present inventors have found that the foregoing objects can be achieved by the following configurations.

(1) A phase difference film including, in the following order, an optically anisotropic layer X, an optically anisotropic layer Y, and an optically anisotropic layer Z,
in which the optically anisotropic layer X is an A-plate,
the optically anisotropic layer Y is a layer formed by fixing a first liquid crystal compound twist-aligned along a helical axis extending in a thickness direction,
the optically anisotropic layer Z is a layer formed by fixing a second liquid crystal compound twist-aligned along a helical axis extending in a thickness direction,
one of the first liquid crystal compound and the second liquid crystal compound is a rod-like liquid crystal compound, and the other of the first liquid crystal compound and the second liquid crystal compound is a disk-like liquid crystal compound, and
an in-plane slow axis of the optically anisotropic layer X is parallel to an in-plane slow axis on a surface of the optically anisotropic layer Y on an optically anisotropic layer X side.

(2) The phase difference film according to (1), in which the optically anisotropic layer X includes a positive A-plate and a negative A-plate,
in a case where the positive A-plate and the negative A-plate are disposed in this order from a surface of the optically anisotropic layer X opposite to an optically anisotropic layer Y side, the first liquid crystal compound is a rod-like liquid crystal compound, and the second liquid crystal compound is a disk-like liquid crystal compound, and
in a case where the negative A-plate and the positive A-plate are disposed in this order from the surface of the optically anisotropic layer X opposite to the optically anisotropic layer Y side, the first liquid crystal compound is a disk-like liquid crystal compound, and the second liquid crystal compound is a rod-like liquid crystal compound.

(3) The phase difference film according to (2), in which an in-plane retardation at a wavelength of 550 nm of the A-plate on the side of the optically anisotropic layer X opposite to the optically anisotropic layer Y side is 20 to 90 nm, and
an in-plane retardation at a wavelength of 550 nm of the A plate of the optically anisotropic layer X on the optically anisotropic layer Y side is 70 to 200 nm.

(4) The phase difference film according to (2) or (3), in which a twisted angle of the first liquid crystal compound is within a range of 40°±20°.

(5) The phase difference film according to any one of (2) to (4), in which a twisted angle of the second liquid crystal compound is within a range of 40°±20°.

(6) The phase difference film according to any one of (2) to (5), in which a value of a product $\Delta nd$ of a refractive index anisotropy $\Delta n$ of the optically anisotropic layer Y at a wavelength of 550 nm and a thickness d of the optically anisotropic layer Y is 50 to 120 nm.

(7) The phase difference film according to any one of (2) to (6), in which a value of a product $\Delta nd$ of a refractive index anisotropy $\Delta n$ of the optically anisotropic layer Z at a wavelength of 550 nm and a thickness d of the optically anisotropic layer Z is 50 to 120 nm.

(8) The phase difference film according to (1), in which the optically anisotropic layer X is a positive A-plate or a negative A-plate,
in a case where the optically anisotropic layer X is a positive A-plate, the first liquid crystal compound is a disk-like liquid crystal compound, and the second liquid crystal compound is a rod-like liquid crystal compound, and
in a case where the optically anisotropic layer X is a negative A-plate, the first liquid crystal compound is a rod-like liquid crystal compound, and the second liquid crystal compound is a disk-like liquid crystal compound.

(9) The phase difference film according to (8), in which an in-plane retardation of the optically anisotropic layer X at a wavelength of 550 nm is 120 to 240 nm.

(10) The phase difference film according to (8) or (9), in which a twisted angle of the first liquid crystal compound is 80°±30°.

(11) The phase difference film according to any one of (8) to (10), in which a twisted angle of the second liquid crystal compound is 175°±30°.

(12) The phase difference film according to any one of (8) to (11), in which a value of a product Δnd of a refractive index anisotropy Δn of the optically anisotropic layer Y at a wavelength of 550 nm and a thickness d of the optically anisotropic layer Y is 120 to 240 nm.

(13) The phase difference film according to any one of (8) to (12), in which a value of a product Δnd of a refractive index anisotropy Δn of the optically anisotropic layer Z at a wavelength of 550 nm and a thickness d of the optically anisotropic layer Z is 70 to 190 nm.

(14) A circularly polarizing plate including a polarizer and the phase difference film according to any one of (1) to (13).

(15) A display device including the phase difference film according to any one of (1) to (13) or the circularly polarizing plate according to (14).

According to an aspect of the present invention, it is possible to provide a phase difference film that has a small change in tint in a case where the phase difference film is applied to a display device as a circularly polarizing plate in combination with a polarizer, and the display device is observed from an oblique direction at all azimuthal angles.

According to another aspect of the present invention, it is possible to provide a circularly polarizing plate and a display device.

DESCRIPTION OF THE PREFERRED EMBODIMENTS

Figure 1:
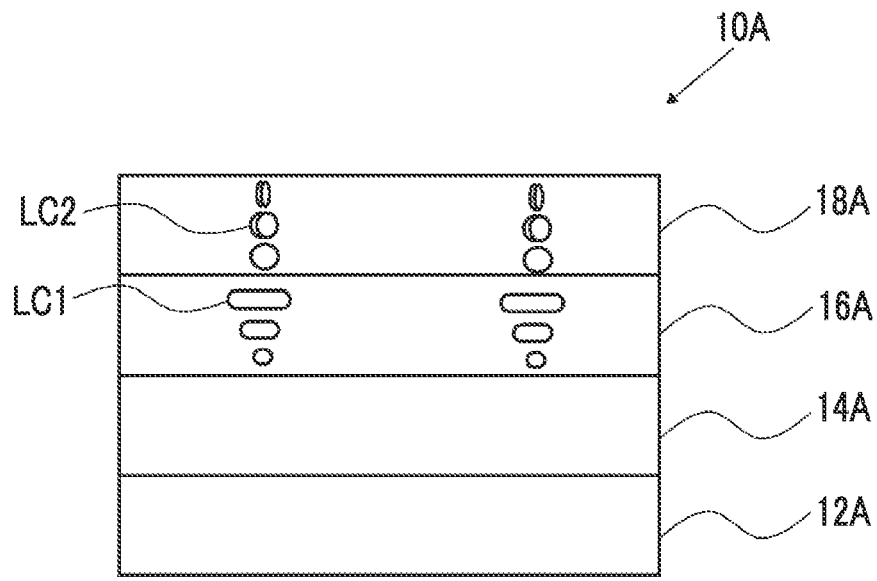
FIG. 1 is an example of a schematic cross-sectional view of a first embodiment of a phase difference film of the present invention.

Hereinafter, the present invention will be described in more detail.

Any numerical range expressed using "to" in the present specification refers to a range including the numerical values before and after the "to" as a lower limit value and an upper limit value, respectively.

In addition, the in-plane slow axis and the in-plane fast axis are defined at a wavelength of 550 nm unless otherwise specified. That is, unless otherwise specified, for example, the in-plane slow axis direction means a direction of the in-plane slow axis at a wavelength of 550 nm.

In the present invention, Re(λ) and Rth(λ) represent an in-plane retardation at a wavelength of λ and a thickness direction retardation at a wavelength of λ, respectively. Unless otherwise specified, the wavelength of λ is 550 nm.

In the present invention, Re(λ) and Rth(λ) are values measured at a wavelength of λ in AxoScan OPMF-1 (manufactured by Opto Science, Inc.). By inputting an average refractive index ((nx+ny+nz)/3) and a film thickness (d (μm)) to AxoScan, the values can be calculated:
Slow Axis Direction (°)

$Re(\lambda)=R0(\lambda)$ $Rth(\lambda)=((nx+ny)/2-nz)\times d$

It should be noted that R0(k) is displayed as a numerical value calculated by AxoScan OPMF-1, and means Re(λ).

In the present specification, the refractive indexes nx, ny, and nz are measured using an Abbe refractometer (NAR-4T, manufactured by Atago Co., Ltd.) and using a sodium lamp (λ=589 nm) as a light source. In addition, in a case where a wavelength dependence is measured, the wavelength dependence can be measured with a multi-wavelength Abbe refractometer DR-M2 (manufactured by Atago Co., Ltd.) in combination with a dichroic filter.

In addition, the values in Polymer Handbook (John Wiley & Sons, Inc.) and catalogs of various optical films can be used. Examples of average refractive index values for major optical films are given below: cellulose acylate (1.48), cycloolefin polymer (1.52), polycarbonate (1.59), polymethyl methacrylate (1.49), and polystyrene (1.59).

In the present specification, the A-plate and the C-plate are defined as follows.

There are two types of A-plates, that is, a positive A-plate (A-plate which is positive) and a negative A-plate (A-plate which is negative). The positive A-plate satisfies the relationship of Expression (A1) and the negative A-plate satisfies the relationship of Expression (A2) in a case where a refractive index in a film in-plane slow axis direction (in a direction in which an in-plane refractive index is maximum) is defined as nx, a refractive index in an in-plane direction orthogonal to the in-plane slow axis is defined as ny, and a refractive index in a thickness direction is defined as nz. It should be noted that the positive A-plate has an Rth showing a positive value and the negative A-plate has an Rth showing a negative value.

$$nx > ny \approx nz \quad \text{Expression (A1)}$$

$$ny < nx \approx nz \quad \text{Expression (A2)}$$

It should be noted that the symbol "≈" encompasses not only a case where the both sides are completely the same as each other but also a case where the both sides are substantially the same as each other. The expression "substantially the same" means that, for example, a case where (ny−nz)×d (in which d is a thickness of a film) is −10 to 10 nm and preferably −5 to 5 nm is also included in "ny≈nz"; and a case where (nx−nz)×d is −10 to 10 nm and preferably −5 to 5 nm is also included in "nx≈nz".

There are two types of C-plates, that is, a positive C-plate (C-plate which is positive) and a negative C-plate (C-plate which is negative). The positive C-plate satisfies the relationship of Expression (C1) and the negative C-plate satisfies the relationship of Expression (C2). It should be noted that the positive C-plate has an Rth showing a negative value and the negative C-plate has an Rth showing a positive value.

$$nz > nx \approx ny \quad \text{Expression (C1)}$$

$$nz < nx \approx ny \quad \text{Expression (C2)}$$

It should be noted that the symbol "≈" encompasses not only a case where the both sides are completely the same as each other but also a case where the both sides are substantially the same as each other. The expression "substantially the same" means that, for example, a case where (nx−ny)×d (in which d is a thickness of a film) is 0 to 10 nm and preferably 0 to 5 nm is also included in "nx≈ny".

In the present specification, the "visible light" is intended to refer to light having a wavelength of 400 to 700 nm. In addition, the "ultraviolet ray" is intended to refer to light having a wavelength of 10 nm or longer and shorter than 400 nm.

In addition, in the present specification, the term "orthogonal" or "parallel" is intended to include a range of errors acceptable in the art to which the present invention pertains. For example, it means that an angle is in an error range of ±5° with respect to the exact angle, and the error with respect to the exact angle is preferably in a range of ±3°.

A feature point of the phase difference film according to the embodiment of the present invention is that predetermined optically anisotropic layers are used in combination.

The phase difference film according to the embodiment of the present invention is a phase difference film including an optically anisotropic layer X, an optically anisotropic layer Y, and an optically anisotropic layer Z in this order, in which the optically anisotropic layer X is an A-plate, the optically anisotropic layer Y is a layer formed by fixing a first liquid crystal compound twist-aligned along a helical axis extending in a thickness direction, the optically anisotropic layer Z is a layer formed by fixing a second liquid crystal compound twist-aligned along a helical axis extending in a thickness direction, one of the first liquid crystal compound and the second liquid crystal compound is a rod-like liquid crystal compound, the other of the first liquid crystal compound and the second liquid crystal compound is a disk-like liquid crystal compound, and an in-plane slow axis of the optically anisotropic layer X is parallel to an in-plane slow axis on a surface of the optically anisotropic layer Y on an optically anisotropic layer X side.

In the first embodiment of the phase difference film which will be described later, the optically anisotropic layer X is composed of a first optically anisotropic layer 12A and a second optically anisotropic layer 14A, the optically anisotropic layer Y is composed of a third optically anisotropic layer 16A, and the optically anisotropic layer Z is composed of a fourth optically anisotropic layer 18A.

In addition, in the second embodiment of the phase difference film, the optically anisotropic layer X is composed of a first optically anisotropic layer 12B and a second optically anisotropic layer 14B, the optically anisotropic layer Y is composed of a third optically anisotropic layer 16B, and the optically anisotropic layer Z is composed of a fourth optically anisotropic layer 18B.

In addition, in the third embodiment of the phase difference film, the optically anisotropic layer X is composed of a first optically anisotropic layer 12C, the optically anisotropic layer Y is composed of a second optically anisotropic layer 14C, and the optically anisotropic layer Z is composed of a third optically anisotropic layer 16C.

In addition, in the fourth embodiment of the phase difference film, the optically anisotropic layer X is composed of a first optically anisotropic layer 12D, the optically anisotropic layer Y is composed of a second optically anisotropic layer 14D, and the optically anisotropic layer Z is composed of a third optically anisotropic layer 16D.

First Embodiment of Phase Difference Film

Hereinafter, the first embodiment of the phase difference film according to the embodiment of the present invention will be described with reference to the accompanying drawings. FIG. 1 shows a schematic cross-sectional view of the first embodiment of the phase difference film according to the embodiment of the present invention.

A phase difference film 10A has the first optically anisotropic layer 12A, the second optically anisotropic layer 14A, the third optically anisotropic layer 16A, and the fourth optically anisotropic layer 18A in this order.

The first optically anisotropic layer 12A is a positive A-plate, the second optically anisotropic layer 14A is a negative A-plate, the third optically anisotropic layer 16A is a layer formed by fixing a rod-like liquid crystal compound LC1 twist-aligned along a helical axis extending in a thickness direction, and the fourth optically anisotropic layer 18A is a layer formed by fixing a disk-like liquid crystal compound LC2 twist-aligned along a helical axis extending in a thickness direction.

The in-plane slow axis of the first optically anisotropic layer 12A is parallel to the in-plane slow axis of the second optically anisotropic layer 14A.

The in-plane slow axis of the second optically anisotropic layer 14A is parallel to the in-plane slow axis on the surface of the third optically anisotropic layer 16A on the second optically anisotropic layer 14A side.

The in-plane slow axis on the surface of the third optically anisotropic layer 16A on the fourth optically anisotropic layer 18A side is parallel to the in-plane slow axis on the surface of the fourth optically anisotropic layer 18A on the third optically anisotropic layer 16A side.

Hereinafter, each of those layers will be described in detail.

(First Optically Anisotropic Layer 12A)

The first optically anisotropic layer 12A is a positive A-plate.

The in-plane retardation of the first optically anisotropic layer 12A at a wavelength of 550 nm is not particularly limited, and is preferably 20 to 90 nm and more preferably 20 to 80 nm from the viewpoint that there is a smaller change in tint (hereinafter, also simply referred to as "the effect of the present invention is more excellent") in a case where the phase difference film according to the embodiment of the present invention is combined with a polarizer and then applied as a circularly polarizing plate to a display device, and the display device is observed from an oblique direction at all azimuthal angles.

The thickness direction retardation of the first optically anisotropic layer 12A at a wavelength of 550 nm is not particularly limited, and is preferably 10 to 45 nm and more preferably 10 to 40 nm from the viewpoint that the effect of the present invention is more excellent.

The first optically anisotropic layer 12A may exhibit forward wavelength dispersibility (a characteristic that the in-plane retardation decreases as the measurement wavelength increases) or reverse wavelength dispersibility (a characteristic that the in-plane retardation increases as the measurement wavelength increases). The forward wavelength dispersibility and the reverse wavelength dispersibility are preferably exhibited in a visible light range.

The configuration of the first optically anisotropic layer 12A is not particularly limited as long as it is a positive A-plate, and examples thereof include a layer formed by fixing a rod-like liquid crystal compound homogeneously aligned and a stretching film, among which a layer formed by fixing a rod-like liquid crystal compound homogeneously aligned is preferable from the viewpoint that the effect of the present invention is more excellent.

The homogeneous alignment in the present specification refers to a state in which a molecular axis of a liquid crystal compound (for example, a major axis in a case of a rod-like liquid crystal compound) is arranged horizontally and in the same direction with respect to the surface of the layer (optical uniaxiality).

Here, "horizontal" does not require that the molecular axis of the liquid crystal compound is strictly horizontal with respect to the layer surface, but is intended to mean an alignment in which the tilt angle formed by the average molecular axis of the liquid crystal compound and the main surface of the layer is less than 20°.

In addition, the "same direction" does not require that the major axis of the liquid crystal compound is arranged strictly in the same direction with respect to the surface of the layer, but is intended to mean that, in a case where the direction of the slow axis is measured at any 20 positions in the plane, the maximum difference between the slow axis directions among the slow axis directions at 20 positions (the difference between the two slow axis directions having a maximum difference among the 20 slow axis directions) is less than 10°.

A known compound can be used as the rod-like liquid crystal compound.

Examples of the rod-like liquid crystal compound include the compounds described in claim 1 of JP1999-513019A (JP-H11-513019A) and paragraphs to of JP2005-289980A.

The rod-like liquid crystal compound may have a polymerizable group.

In the present specification, the type of the polymerizable group is not particularly limited, and is preferably a functional group capable of an addition polymerization reaction, more preferably a polymerizable ethylenically unsaturated group or a ring-polymerizable group, and still more preferably a (meth)acryloyl group, a vinyl group, a styryl group, or an allyl group.

The first optically anisotropic layer 12A is preferably a layer formed by fixing a rod-like liquid crystal compound having a polymerizable group by means of polymerization.

The thickness of the first optically anisotropic layer 12A is not particularly limited, and is preferably 10 μm or less, more preferably 0.1 to 5.0 μm, and still more preferably 0.3 to 2.0 μm.

The thickness of the first optically anisotropic layer 12A is intended to refer to an average thickness of the first optically anisotropic layer 12A. The average thickness is obtained by measuring the thicknesses of any five or more points of the first optically anisotropic layer 12A and arithmetically averaging the measured values.

(Second Optically Anisotropic Layer 14A)

The second optically anisotropic layer 14A is a negative A-plate.

The in-plane retardation of the second optically anisotropic layer 14A at a wavelength of 550 nm is not particularly limited, and is preferably 70 to 200 nm and more preferably 80 to 190 nm from the viewpoint that the effect of the present invention is more excellent.

The thickness direction retardation of the second optically anisotropic layer 14A at a wavelength of 550 nm is not particularly limited, and is preferably −100 to −35 nm and more preferably −95 to −40 nm from the viewpoint that the effect of the present invention is more excellent.

The second optically anisotropic layer 14A may exhibit forward wavelength dispersibility (a characteristic that the in-plane retardation decreases as the measurement wavelength increases) or reverse wavelength dispersibility (a characteristic that the in-plane retardation increases as the measurement wavelength increases). The forward wavelength dispersibility and the reverse wavelength dispersibility are preferably exhibited in a visible light range.

The configuration of the second optically anisotropic layer 14A is not particularly limited as long as it is a negative A-plate, and examples thereof include a layer formed by fixing a disk-like liquid crystal compound that is vertically aligned and whose optical axis (axis orthogonal to the disc plane) is arranged in the same direction and a stretching film, among which a layer formed by fixing a disk-like liquid crystal compound that is vertically aligned and whose optical axis (axis orthogonal to the disc plane) is arranged in the same direction is preferable from the viewpoint that the effect of the present invention is more excellent.

The state in which a disk-like liquid crystal compound is vertically aligned means that the disc plane of the disk-like liquid crystal compound is parallel to the thickness direction of the layer. It is not required to be strictly parallel, but an angle formed by the disc plane and the thickness direction of the layer is preferably in a range of 0°±20° and more preferably in a range of 0°±10°.

In addition, the state in which optical axes (axes orthogonal to the disc plane) of the disk-like liquid crystal compound are arranged in the same orientation does not require that the optical axes of the disk-like liquid crystal compound are arranged strictly in the same orientation, but it is intended that, in a case where orientations of the slow axes are measured at any 20 positions in the plane, the maximum difference in slow axis orientation among the slow axis orientations at 20 positions (the difference between two slow axis orientations having the largest difference among the 20 slow axis orientations) is less than 10°.

A known compound can be used as the disk-like liquid crystal compound.

Examples of the disk-like liquid crystal compound include the compounds described in paragraphs to of JP2007-108732A and paragraphs to of JP2010-244038A.

The disk-like liquid crystal compound may have a polymerizable group.

The types of polymerizable groups that the disk-like liquid crystal compound may have are as described above.

The second optically anisotropic layer 14A is preferably a layer formed by fixing a disk-like liquid crystal compound having a polymerizable group by means of polymerization.

The in-plane slow axis of the first optically anisotropic layer 12A is parallel to the in-plane slow axis of the second optically anisotropic layer 14A.

The thickness of the second optically anisotropic layer 14A is not particularly limited, and is preferably 10 μm or less, more preferably 0.1 to 5.0 μm, and still more preferably 0.3 to 2.0 μm.

The thickness of the second optically anisotropic layer 14A is intended to refer to an average thickness of the second optically anisotropic layer 14A. The average thickness is obtained by measuring the thicknesses of any five or more points of the second optically anisotropic layer 14A and arithmetically averaging the measured values.

(Third Optically Anisotropic Layer 16A)

The third optically anisotropic layer 16A is a layer formed by fixing a rod-like liquid crystal compound LC1 twist-aligned along a helical axis extending in a thickness direction.

The third optically anisotropic layer 16A is preferably a layer formed by fixing a so-called chiral nematic phase having a helical structure. In a case of forming the third optically anisotropic layer 16A, it is preferable to use at least a liquid crystal compound and a chiral agent which will be described later.

The twisted angle of the rod-like liquid crystal compound (twisted angle of the liquid crystal compound in an alignment direction) is not particularly limited, and is often more than 0° and 360° or less. From the viewpoint that the effect of the present invention is more excellent, the twisted angle of the rod-like liquid crystal compound is preferably within a range of 40°±20° (within a range of 20° to 60°) and more preferably within a range of 40°±15° (within a range of 25° to 55°).

The twisted angle is measured using an AxoScan (polarimeter) device of Axometrics, Inc. and using device analysis software of Axometrics, Inc.

In addition, the expression "rod-like liquid crystal compound is twist-aligned" is intended to mean that the rod-like liquid crystal compound from one main surface to the other main surface of the third optically anisotropic layer 16A is twisted around the thickness direction of the third optically anisotropic layer 16A. Along with this, the alignment direction (in-plane slow axis direction) of the rod-like liquid crystal compound varies depending on the position in the thickness direction of the third optically anisotropic layer 16A.

In the twisted alignment, the major axis of the rod-like liquid crystal compound is arranged so as to be parallel to the main surface of the third optically anisotropic layer 16A. It is not required to be strictly parallel, and the angle formed by the major axis of the rod-like liquid crystal compound and the main surface of the third optically anisotropic layer 16A is preferably in a range of 0°±20° and more preferably in a range of 0°±10°.

A value of a product $\Delta nd$ of a refractive index anisotropy $\Delta n$ of the third optically anisotropic layer 16A at a wavelength of 550 nm and a thickness d of the third optically anisotropic layer 16A is not particularly limited, and is preferably 50 to 120 nm and more preferably 55 to 115 nm from the viewpoint that the effect of the present invention is more excellent.

The $\Delta nd$ is measured using an AxoScan (polarimeter) device of Axometrics, Inc. and using device analysis software of Axometrics, Inc.

The in-plane slow axis of the second optically anisotropic layer 14A is parallel to the in-plane slow axis on the surface of the third optically anisotropic layer 16A on the second optically anisotropic layer 14A side.

The type of the rod-like liquid crystal compound used for forming the third optically anisotropic layer 16A is not particularly limited, and examples thereof include known compounds.

The rod-like liquid crystal compound may have a polymerizable group.

The types of polymerizable groups that the rod-like liquid crystal compound may have are as described above.

The third optically anisotropic layer 16A is preferably a layer formed by fixing a rod-like liquid crystal compound having a polymerizable group by means of polymerization. More specifically, the third optically anisotropic layer 16A is more preferably a layer formed by fixing a rod-like liquid crystal compound twist-aligned and having a polymerizable group by means of polymerization.

The thickness of the third optically anisotropic layer 16A is not particularly limited, and is preferably 10 μm or less, more preferably 0.1 to 5.0 μm, and still more preferably 0.3 to 2.0 μm.

The thickness of the third optically anisotropic layer 16A is intended to refer to an average thickness of the third optically anisotropic layer 16A. The average thickness is obtained by measuring the thicknesses of any five or more points of the third optically anisotropic layer 16A and arithmetically averaging the measured values.

(Fourth Optically Anisotropic Layer 18A)

The fourth optically anisotropic layer 18A is a layer formed by fixing a disk-like liquid crystal compound LC2 twist-aligned along a helical axis extending in a thickness direction.

In a case of forming the fourth optically anisotropic layer 18A, it is preferable to use at least a disk-like liquid crystal compound and a chiral agent which will be described later.

The twisted angle of the disk-like liquid crystal compound (twisted angle of the disk-like liquid crystal compound in an alignment direction) is not particularly limited, and is often more than 0° and 360° or less. From the viewpoint that the effect of the present invention is more excellent, the twisted angle of the disk-like liquid crystal compound is preferably within a range of 40°±20° (within a range of 20° to 60°) and more preferably within a range of 40°±15° (within a range of 25° to 55°).

The twisted angle is measured using an AxoScan (polarimeter) device of Axometrics, Inc. and using device analysis software of Axometrics, Inc.

In addition, the expression "disk-like liquid crystal compound is twist-aligned" is intended to mean that the disk-like liquid crystal compound from one main surface to the other main surface of the fourth optically anisotropic layer 18A is twisted around the thickness direction of the fourth optically anisotropic layer 18A. Along with this, the alignment direction (in-plane slow axis direction) of the disk-like liquid crystal compound varies depending on the position in the thickness direction of the layer.

In the twisted alignment, the disk-like liquid crystal compound is vertically aligned. The state in which the disk-like liquid crystal compound is vertically aligned means that the disc plane of the disk-like liquid crystal compound is parallel to the thickness direction of the layer. It is not required to be strictly parallel, and the angle formed by the disc plane and the thickness direction of the fourth optically anisotropic layer 18A is preferably in a range of 0°±20° and preferably in a range of 0°±10°.

The in-plane slow axis on the surface of the third optically anisotropic layer 16A on the fourth optically anisotropic layer 18A side is parallel to the in-plane slow axis on the surface of the fourth optically anisotropic layer 18A on the third optically anisotropic layer 16A side.

A value of a product $\Delta nd$ of a refractive index anisotropy $\Delta n$ of the fourth optically anisotropic layer 18A at a wavelength of 550 nm and a thickness d of the fourth optically anisotropic layer 18A is not particularly limited, and is preferably 50 to 120 nm and more preferably 55 to 115 nm from the viewpoint that the effect of the present invention is more excellent.

The $\Delta nd$ is measured using an AxoScan (polarimeter) device of Axometrics, Inc. and using device analysis software of Axometrics, Inc.

The type of the disk-like liquid crystal compound used for forming the fourth optically anisotropic layer 18A is not particularly limited, and examples thereof include known compounds.

The disk-like liquid crystal compound may have a polymerizable group.

The types of polymerizable groups that the disk-like liquid crystal compound may have are as described above.

The fourth optically anisotropic layer 18A is preferably a layer formed by fixing a disk-like liquid crystal compound having a polymerizable group by means of polymerization. More specifically, the fourth optically anisotropic layer 18A is more preferably a layer formed by fixing a disk-like liquid crystal compound twist-aligned and having a polymerizable group by means of polymerization.

The thickness of the fourth optically anisotropic layer 18A is not particularly limited, and is preferably 10 μm or less, more preferably 0.1 to 5.0 μm, and still more preferably 0.3 to 2.0 μm.

The thickness of the fourth optically anisotropic layer 18A is intended to refer to an average thickness of the fourth optically anisotropic layer 18A. The average thickness is obtained by measuring the thicknesses of any five or more points of the fourth optically anisotropic layer 18A and arithmetically averaging the measured values.

(Other Members)

The phase difference film 10A may include members other than the above-mentioned first optically anisotropic layer 12A to fourth optically anisotropic layer 18A.

(Adhesion Layer)

The phase difference film 10A may have an adhesion layer between the optically anisotropic layers.

Examples of the adhesion layer include known pressure sensitive adhesive layers and adhesive layers.

As described in JP1999-149015A (JP-H11-149015A), it is generally preferable to adjust the refractive index of each layer (for example, an optically anisotropic layer) forming the phase difference film from the viewpoint of suppressing reflection. The difference in refractive index from that of an adhesion target is preferably 0.1 or less, more preferably 0.08 or less, still more preferably 0.06 or less, and particularly preferably 0.03 or less.

In a case where the adhesion layer is disposed between the layers of the optically anisotropic layers formed by fixing a liquid crystal compound, a high-refractive adhesive or pressure sensitive adhesive may be used.

In order to increase the refractive index, it is also preferable to use a high-refractive monomer or a high-refractive metal fine particle.

The high-refractive monomer preferably has a benzene ring skeleton in a molecule thereof. Examples of the monofunctional monomer having a benzene ring skeleton in a molecule thereof include ethoxylated o-phenylphenol (meth)acrylate, o-phenylphenol glycidyl ether (meth)acrylate, para-cumylphenoxyethylene glycol (meth)acrylate, 2-methacryloyloxyethyl phthalate, 2-acryloyloxyethyl phthalate, 2-acryloyloxyethyl-2-hydroxyethyl phthalate, 2-acryloyloxypropyl phthalate, phenoxyethyl (meth)acrylate, EO-modified phenol (meth)acrylate, phenoxydiethylene glycol (meth)acrylate, EO-modified nonylphenol (meth)acrylate, PO-modified nonylphenol (meth)acrylate, phenyl glycidyl ether (meth)acrylate, neopentyl glycol benzoate (meth)acrylate, nonylphenoxypolyethylene glycol (meth)acrylate, ECH-modified phenoxy (meth)acrylate, benzyl (meth)acrylate, and vinyl carbazole.

Examples of the high-refractive metal fine particle include an inorganic particle. Examples of the component constituting the inorganic particle include a metal oxide, a metal nitride, a metal oxynitride, and a simple substance of metal. Examples of the metal atom contained in the metal oxide, the metal nitride, the metal oxynitride, and the simple substance of metal include a titanium atom, a silicon atom, an aluminum atom, a cobalt atom, and a zirconium atom. Specific examples of the inorganic particle include inorganic oxide particles such as an alumina particle, an alumina hydrate particle, a silica particle, a zirconia particle, and a clay mineral (for example, smectite). A zirconium oxide particle is preferable from the viewpoint of refractive index.

The refractive index can be adjusted to a predetermined value by changing the amount of inorganic particles.

The average particle diameter of the inorganic particles is not particularly limited. In a case where zirconium oxide is used as a main component, the average particle diameter of the zirconium oxide particles is preferably 1 to 120 nm, more preferably 1 to 60 nm, and still more preferably 2 to 40 nm.

(Alignment Film)

The phase difference film 10A may further have an alignment film. The alignment film may be disposed between the optically anisotropic layers.

As shown in FIG. 1, it is preferable that the phase difference film 10A does not have an alignment film between the optically anisotropic layers.

The alignment film can be formed by means such as rubbing treatment of an organic compound (preferably a polymer), oblique vapor deposition of an inorganic compound, formation of a layer having microgrooves, or accumulation of an organic compound (for example, ω-tricosanoic acid, dioctadecylmethylammonium chloride, or methyl stearate) by the Langmuir-Blodgett method (LB film).

Further, there is also known an alignment film capable of expressing an alignment function by application of an electric field, application of a magnetic field, or irradiation with light (preferably polarized light).

The alignment film is preferably formed by a rubbing treatment of a polymer.

Examples of the alignment film include a photo-alignment film.

The thickness of the alignment film is not particularly limited as long as it can exhibit an alignment function, and is preferably 0.01 to 5.0 μm, more preferably 0.05 to 2.0 μm, and still more preferably 0.1 to 0.5 μm.

The alignment film may be peelable from the phase difference film together with a substrate which will be described later.

(Substrate)

The phase difference film 10A may further have a substrate.

The substrate is preferably a transparent substrate. The transparent substrate is intended to refer to a substrate having a visible light transmittance of 60% or more, which preferably has a visible light transmittance of 80% or more and more preferably 90% or more.

The thickness of the substrate is not particularly limited, and is preferably 10 to 200 μm, more preferably 10 to 100 μm, and still more preferably 20 to 90 μm.

In addition, the substrate may consist of a plurality of layers laminated. In order to improve the adhesion of the substrate to the layer provided thereon, the surface of the substrate may be subjected to a surface treatment (for example, a glow discharge treatment, a corona discharge treatment, an ultraviolet (UV) treatment, or a flame treatment).

In addition, an adhesive layer (undercoat layer) may be provided on the substrate.

The substrate may be peelable from the phase difference film.

(Method for Producing Phase Difference Film)

The method for producing a phase difference film is not particularly limited, and a known method can be used.

For example, a phase difference film can be produced by preparing each of the first optically anisotropic layer to the fourth optically anisotropic layer and bonding the prepared optically anisotropic layers in a predetermined order through an adhesion layer (for example, a pressure sensitive adhesive layer or an adhesive layer).

In addition, the first optically anisotropic layer to the fourth optically anisotropic layer can be produced by using compositions for forming an optically anisotropic layer containing a liquid crystal compound having a polymerizable group, each of which can be separately formed.

Hereinafter, the method for producing an optically anisotropic layer (first optically anisotropic layer to fourth optically anisotropic layer) using the composition for forming an optically anisotropic layer containing a liquid crystal compound having a polymerizable group will be described in detail.

The liquid crystal compound having a polymerizable group (hereinafter, also referred to as "polymerizable liquid crystal compound") contained in the composition for forming an optically anisotropic layer is as described above. As described above, a rod-like liquid crystal compound and a disk-like liquid crystal compound are appropriately selected according to the characteristics of an optically anisotropic layer to be formed.

The content of the polymerizable liquid crystal compound in the composition for forming an optically anisotropic layer is preferably 60% to 99% by mass and more preferably 70% to 98% by mass with respect to the total solid content of the composition for forming an optically anisotropic layer.

The solid content means a component capable of forming an optically anisotropic layer, excluding a solvent, and even in a case where a component itself is in a liquid state, such a component is regarded as the solid content.

The composition for forming an optically anisotropic layer may contain a compound other than the liquid crystal compound having a polymerizable group.

For example, the composition for forming an optically anisotropic layer for forming the third optically anisotropic layer 16A and the fourth optically anisotropic layer 18A preferably contain a chiral agent in order to twist-align a liquid crystal compound. The chiral agent is added to twist-align a liquid crystal compound, but of course, it is not necessary to add the chiral agent in a case where the liquid crystal compound is a compound exhibiting an optical activity such as having an asymmetric carbon in a molecule. In addition, addition of the chiral agent may not be necessary depending on the production method and the twisted angle.

There is no particular limitation on the structure of the chiral agent as long as the chiral agent is compatible with the liquid crystal compound used in combination. Any of known chiral agents (for example, the chiral agents described in "Liquid Crystal Device Handbook" edited by the 142nd Committee of the Japan Society for the Promotion of Science, Chapter 3, 4-3, Chiral agents for TN and STN, p. 199, 1989) can be used.

The amount of the chiral agent used is not particularly limited and is adjusted such that the above-mentioned twisted angle is achieved.

The composition for forming an optically anisotropic layer may contain a polymerization initiator. The polymerization initiator used is selected according to the type of polymerization reaction, and examples thereof include a thermal polymerization initiator and a photopolymerization initiator.

The content of the polymerization initiator in the composition for forming an optically anisotropic layer is preferably 0.01% to 20% by mass and more preferably 0.5% to 10% by mass with respect to the total solid content of the composition for forming an optically anisotropic layer.

Examples of other components that may be contained in the composition for forming an optically anisotropic layer include a polyfunctional monomer, an alignment control agent (a vertical alignment agent and a horizontal alignment agent), a surfactant, an adhesion improver, a plasticizer, and a solvent, in addition to the foregoing components.

Examples of the method of applying the composition for forming an optically anisotropic layer include a curtain coating method, a dip coating method, a spin coating method, a printing coating method, a spray coating method, a slot coating method, a roll coating method, a slide coating method, a blade coating method, a gravure coating method, and a wire bar method.

Next, the formed coating film is subjected to an alignment treatment to align a polymerizable liquid crystal compound in the coating film. For example, in a case where the first optically anisotropic layer 12A is formed, a rod-like liquid crystal compound is homogeneously aligned. In addition, in a case where the second optically anisotropic layer 14A is formed, a disk-like liquid crystal compound is vertically aligned such that the optical axis (the axis orthogonal to the disc plane) of the disk-like liquid crystal compound is arranged in the same direction. In addition, in a case where the third optically anisotropic layer 16A is formed, a rod-like liquid crystal compound is twist-aligned. In addition, in a case where the fourth optically anisotropic layer 18A is formed, a disk-like liquid crystal compound is twist-aligned.

The alignment treatment can be carried out by drying the coating film at room temperature or by heating the coating film. In a case of a thermotropic liquid crystal compound, the liquid crystal phase formed by the alignment treatment can generally be transferred by a change in temperature or pressure. In a case of a lyotropic liquid crystal compound, the liquid crystal phase formed by the alignment treatment can also be transferred by a compositional ratio such as an amount of a solvent.

The conditions in a case of heating the coating film are not particularly limited, and the heating temperature is preferably 50° C. to 250° C. and more preferably 50° C. to 150° C., and the heating time is preferably 10 seconds to 10 minutes.

In addition, after the coating film is heated, the coating film may be cooled, if necessary, before a curing treatment (light irradiation treatment) which will be described later.

Next, the coating film in which the polymerizable liquid crystal compound is aligned is subjected to a curing treatment.

The method of the curing treatment carried out on the coating film in which the polymerizable liquid crystal compound is aligned is not particularly limited, and examples thereof include a light irradiation treatment and a heat treatment. Above all, from the viewpoint of manufacturing suitability, a light irradiation treatment is preferable, and an ultraviolet irradiation treatment is more preferable.

The irradiation conditions of the light irradiation treatment are not particularly limited, and an irradiation amount of 50 to 1,000 mJ/cm$^2$ is preferable.

The atmosphere during the light irradiation treatment is not particularly limited and is preferably a nitrogen atmosphere.

First Embodiment of Circularly Polarizing Plate

The first embodiment of the phase difference film according to the embodiment of the present invention can be used as a circularly polarizing plate in combination with a polarizer. The circularly polarizing plate is an optical element that converts unpolarized light into circularly polarized light.

The circularly polarizing plate according to the embodiment of the present invention having the above-described configuration is suitably used for antireflection applications of a display device such as a liquid crystal display device (LCD), a plasma display panel (PDP), an electroluminescent display (ELD), or a cathode tube display device (CRT).

The polarizer may be a member having a function of converting natural light into specific linearly polarized light, and examples thereof include an absorption type polarizer.

The type of the polarizer is not particularly limited, and a commonly used polarizer can be used. Examples of the polarizer include an iodine-based polarizer, a dye-based polarizer using a dichroic substance, and a polyene-based polarizer. The iodine-based polarizer and the dye-based polarizer are generally prepared by adsorbing iodine or a dichroic dye on a polyvinyl alcohol, followed by stretching.

A protective film may be disposed on one side or both sides of the polarizer.

Figure 2:
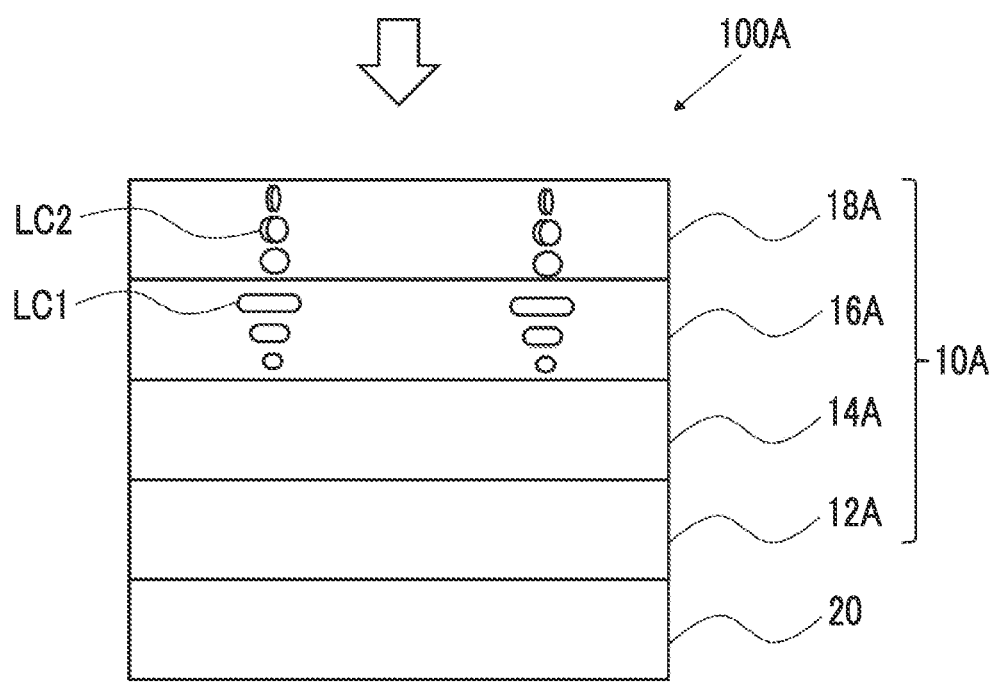
FIG. 2 is an example of a schematic cross-sectional view of a first embodiment of a circularly polarizing plate of the present invention.
Figure 3:
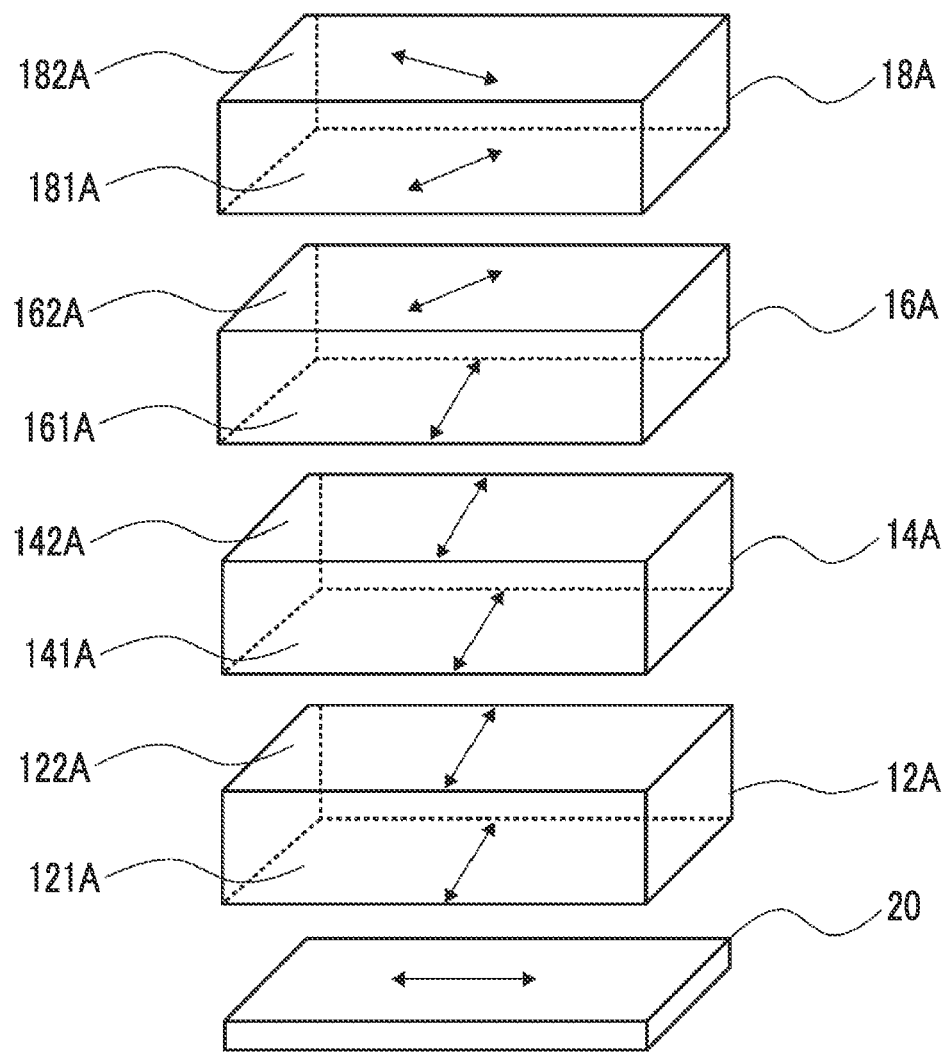
FIG. 3 is a view showing a relationship between an absorption axis of a polarizer and an in-plane slow axis of each of a first optically anisotropic layer to a fourth optically anisotropic layer in the first embodiment of the circularly polarizing plate of the present invention.

FIG. 2 shows a schematic cross-sectional view of an embodiment of a circularly polarizing plate 100A. In addition, FIG. 3 is a view showing a relationship between an absorption axis of a polarizer 20 and an in-plane slow axis of each of the first optically anisotropic layer 12A to the fourth optically anisotropic layer 18A in the circularly polarizing plate 100A shown in FIG. 2. In FIG. 3, the arrow in the polarizer 20 indicates an absorption axis, and the arrow in the first optically anisotropic layer 12A to the fourth optically anisotropic layer 18A indicates an in-plane slow axis in each layer.

Figure 4:
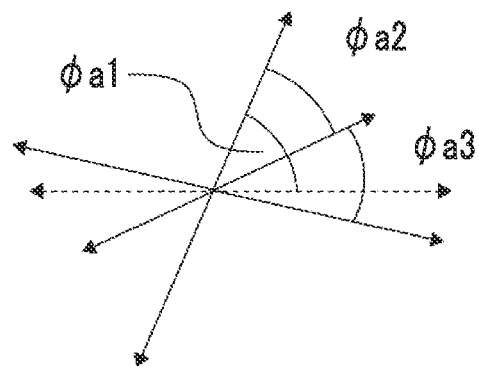
FIG. 4 is a schematic view showing a relationship of an angle between the absorption axis of the polarizer and the in-plane slow axis of each of the first optically anisotropic layer to the fourth optically anisotropic layer, upon observation from the direction of a white arrow in FIG. 2.

In addition, FIG. 4 is a view showing a relationship of the angle between the absorption axis (broken line) of the polarizer 20 and the in-plane slow axis (solid line) of each of the first optically anisotropic layer 12A to the fourth optically anisotropic layer 18A, upon observation from the white arrow in FIG. 2.

The rotation angle of the in-plane slow axis is represented by a positive angle value in a counterclockwise direction and a negative angle value in a clockwise direction, with reference to the absorption axis of the polarizer 20 (0°), upon observation from the white arrow in FIG. 2. In addition, whether the twisted direction is a right-handed twist (clockwise) or a left-handed twist (counterclockwise) is determined with reference to the in-plane slow axis on the surface of the front side (the side opposite to the polarizer 20 side) in the third optically anisotropic layer 16A and the fourth optically anisotropic layer 18A, upon observation from the white arrow in FIG. 2.

As shown in FIG. 2, the circularly polarizing plate 100A includes the polarizer 20, the first optically anisotropic layer 12A, the second optically anisotropic layer 14A, the third optically anisotropic layer 16A, and the fourth optically anisotropic layer 18A in this order.

As shown in FIG. 3 and FIG. 4, an angle φa1 formed by the absorption axis of the polarizer 20 and the in-plane slow axis of the first optically anisotropic layer 12A is 75°. More specifically, the in-plane slow axis of the first optically anisotropic layer 12A is rotated by 75° (counterclockwise 75°) with respect to the absorption axis of the polarizer 20. Although FIG. 3 and FIG. 4 show an aspect in which the in-plane slow axis of the first optically anisotropic layer 12A is at a position of 75°, the present invention is not limited to this aspect. The in-plane slow axis of the first optically anisotropic layer 12A is preferably within a range of 75°±13°. That is, the angle formed by the absorption axis of the polarizer 20 and the in-plane slow axis of the first optically anisotropic layer 12A is preferably within a range of 75°±13°.

As shown in FIG. 3, in the first optically anisotropic layer 12A, the in-plane slow axis on a surface 121A of the first optically anisotropic layer 12A on the polarizer 20 side is parallel to the in-plane slow axis on a surface 122A of the first optically anisotropic layer 12A on the second optically anisotropic layer 14A side.

As shown in FIG. 3 and FIG. 4, the in-plane slow axis of the first optically anisotropic layer 12A is parallel to the in-plane slow axis of the second optically anisotropic layer 14A.

In addition, as shown in FIG. 3, in the second optically anisotropic layer 14A, the in-plane slow axis on a surface 141A of the second optically anisotropic layer 14A on the polarizer 20 side is parallel to the in-plane slow axis on a surface 142A of the second optically anisotropic layer 14A on the third optically anisotropic layer 16A side.

In addition, as shown in FIG. 3, the in-plane slow axis on the surface 142A of the second optically anisotropic layer 14A on the third optically anisotropic layer 16A side is parallel to the in-plane slow axis on a surface 161A of the third optically anisotropic layer 16A on the second optically anisotropic layer 14A side.

As described above, the third optically anisotropic layer 16A is a layer formed by fixing a rod-like liquid crystal compound twist-aligned along a helical axis extending in a thickness direction. Therefore, as shown in FIG. 3 and FIG. 4, the in-plane slow axis on the surface 161A of the third optically anisotropic layer 16A on the second optically anisotropic layer 14A side and the in-plane slow axis on a surface 162A of the third optically anisotropic layer 16A opposite to the second optically anisotropic layer 14A side form the above-mentioned twisted angle (40° in FIG. 3). That is, an angle φa2 formed by the in-plane slow axis on the surface 161A of the third optically anisotropic layer 16A on the second optically anisotropic layer 14A side and the in-plane slow axis on the surface 162A of the third optically anisotropic layer 16A opposite to the second optically anisotropic layer 14A side is 40°. More specifically, the twisted direction of the rod-like liquid crystal compound in the third optically anisotropic layer 16A is a left-handed twist (counterclockwise), and the twisted angle is 40°. Therefore, the angle formed by the absorption axis of the polarizer 20 and the in-plane slow axis on the surface 162A of the third optically anisotropic layer 16A opposite to the second optically anisotropic layer 14A side is 35°.

Although FIG. 3 and FIG. 4 show an aspect in which the twisted angle of the rod-like liquid crystal compound in the third optically anisotropic layer 16A is 40°, the present invention is not limited to this aspect. The twisted angle of the rod-like liquid crystal compound is preferably within a range of 40°±20°. That is, the angle formed by the in-plane slow axis on the surface 161A of the third optically anisotropic layer 16A on the second optically anisotropic layer 14A side and the in-plane slow axis on the surface 162A of the third optically anisotropic layer 16A opposite to the second optically anisotropic layer 14A side is preferably within a range of 40°±20°.

In addition, as shown in FIG. 3, the in-plane slow axis on the surface 162A of the third optically anisotropic layer 16A on the fourth optically anisotropic layer 18A side is parallel to the in-plane slow axis on a surface 181A of the fourth optically anisotropic layer 18A on the third optically anisotropic layer 16A side.

As described above, the fourth optically anisotropic layer 18A is a layer formed by fixing a disk-like liquid crystal compound twist-aligned along a helical axis extending in a thickness direction. Therefore, as shown in FIG. 3 and FIG. 4, the in-plane slow axis on the surface 181A of the fourth optically anisotropic layer 18A on the third optically anisotropic layer 16A side and the in-plane slow axis on a surface 182A of the fourth optically anisotropic layer 18A opposite to the third optically anisotropic layer 16A side form the above-mentioned twisted angle (40° in FIG. 3). That is, an angle φa3 formed by the in-plane slow axis on the surface 181A of the fourth optically anisotropic layer 18A on the third optically anisotropic layer 16A side and the in-plane slow axis on the surface 182A of the fourth optically anisotropic layer 18A opposite to the third optically anisotropic layer 16A side is 40°. More specifically, the twisted direction of the disk-like liquid crystal compound in the fourth optically anisotropic layer 18A is a left-handed twist (counterclockwise), and the twisted angle is 40°. Therefore, the angle formed by the absorption axis of the polarizer 20 and the in-plane slow axis on the surface 182A of the fourth optically anisotropic layer 18A opposite to the third optically anisotropic layer 16A side is 5°.

Although FIG. 3 and FIG. 4 show an aspect in which the twisted angle of the disk-like liquid crystal compound in the fourth optically anisotropic layer 18A is 40°, the present invention is not limited to this aspect. The twisted angle of the disk-like liquid crystal compound is preferably within a range of 40°±20°. That is, the angle formed by the in-plane slow axis on the surface 181A of the fourth optically anisotropic layer 18A on the third optically anisotropic layer 16A side and the in-plane slow axis on the surface 182A of the fourth optically anisotropic layer 18A opposite to the third optically anisotropic layer 16A side is preferably within a range of 40°±20°.

As described above, in the aspect of FIG. 3 and FIG. 4, the in-plane slow axes of the first optically anisotropic layer 12A and the second optically anisotropic layer 14A are rotated counterclockwise by 75°, the twisted direction of the rod-like liquid crystal compound in the third optically anisotropic layer 16A is counterclockwise (left-handed twist), and the twisted direction of the disk-like liquid crystal compound in the fourth optically anisotropic layer 18A is counterclockwise (left-handed twist), with reference to the absorption axis of the polarizer 20, upon observation of the circularly polarizing plate 100A from the phase difference film 10A side.

In FIG. 3 and FIG. 4, the aspect in which the twisted direction of the liquid crystal compound is counterclockwise is described in detail, but an aspect in which the twisted direction of the liquid crystal compound is clockwise may be configured as long as the relationship of a predetermined angle is satisfied. More specifically, it may be an aspect in which the in-plane slow axes of the first optically anisotropic layer 12A and the second optically anisotropic layer 14A are rotated clockwise by 75°, the twisted direction of the rod-like liquid crystal compound in the third optically anisotropic layer 16A is clockwise (right-handed twist), and the twisted direction of the disk-like liquid crystal compound in the fourth optically anisotropic layer 18A is clockwise (right-handed twist), with reference to the absorption axis of the polarizer 20, upon observation of the circularly polarizing plate 100A from the phase difference film 10A side.

That is, in the circularly polarizing plate including the first embodiment of the phase difference film, in a case where the in-plane slow axes of the first optically anisotropic layer and the second optically anisotropic layer are rotated counterclockwise within a range of 75°±13° (preferably 75°±10°) with reference to the absorption axis of the polarizer, upon observation of the circularly polarizing plate from the phase difference film side, it is preferable that the twisted direction of the rod-like liquid crystal compound in the third optically anisotropic layer is counterclockwise with reference to the in-plane slow axis on the surface of the third optically anisotropic layer on the fourth optically anisotropic layer side, and the twisted direction of the disk-like liquid crystal compound in the fourth optically anisotropic layer is counterclockwise with reference to the in-plane slow axis on the surface of the fourth optically anisotropic layer opposite to the third optically anisotropic layer side.

In addition, in the circularly polarizing plate including the first embodiment of the phase difference film, in a case where the in-plane slow axes of the first optically anisotropic layer and the second optically anisotropic layer are rotated clockwise within a range of 75°±13° (preferably 75°±10°) with reference to the absorption axis of the polarizer, upon observation of the circularly polarizing plate from the phase difference film side, it is preferable that the twisted direction of the rod-like liquid crystal compound in the third optically anisotropic layer is clockwise with reference to the in-plane slow axis on the surface of the third optically anisotropic layer on the fourth optically anisotropic layer side, and the twisted direction of the disk-like liquid crystal compound in the fourth optically anisotropic layer is clockwise with reference to the in-plane slow axis on the surface of the fourth optically anisotropic layer opposite to the third optically anisotropic layer side.

The circularly polarizing plate may have a member other than the phase difference film and the polarizer.

The circularly polarizing plate may have an adhesion layer between the phase difference film and the polarizer.

Examples of the adhesion layer include known pressure sensitive adhesive layers and adhesive layers.

The method for producing the above-described circularly polarizing plate is not particularly limited and may be, for example, a known method.

For example, there is a method of bonding a polarizer and a phase difference film through an adhesion layer.

Second Embodiment of Phase Difference Film

Figure 5:
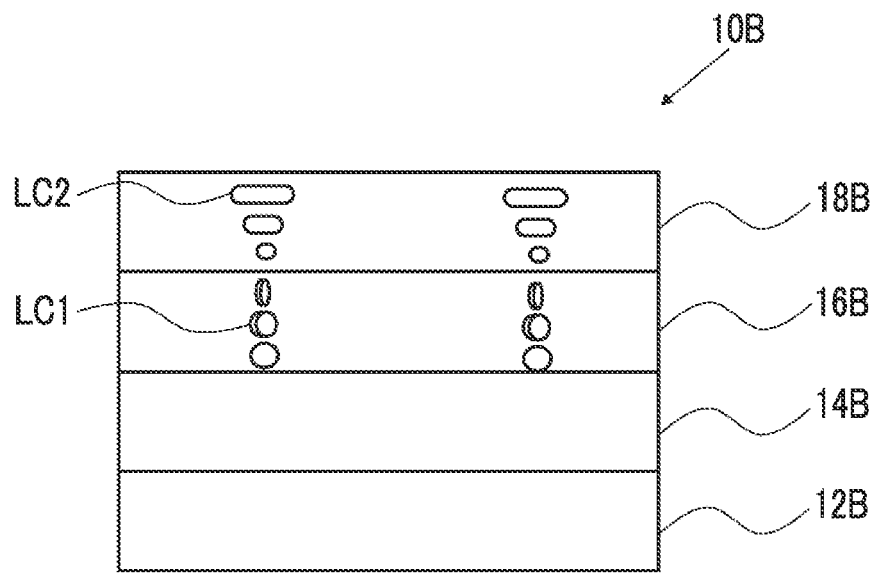
FIG. 5 is an example of a schematic cross-sectional view of a second embodiment of the phase difference film of the present invention.

Hereinafter, the second embodiment of the phase difference film according to the embodiment of the present invention will be described with reference to the accompanying drawings. FIG. 5 shows a schematic cross-sectional view of the second embodiment of the phase difference film according to the embodiment of the present invention.

A phase difference film 10B has a first optically anisotropic layer 12B, a second optically anisotropic layer 14B, a third optically anisotropic layer 16B, and a fourth optically anisotropic layer 18B in this order.

The first optically anisotropic layer 12B is a negative A-plate, the second optically anisotropic layer 14B is a positive A-plate, the third optically anisotropic layer 16B is a layer formed by fixing a disk-like liquid crystal compound LC1 twist-aligned along a helical axis extending in a thickness direction, and the fourth optically anisotropic layer 18B is a layer formed by fixing a rod-like liquid crystal compound LC2 twist-aligned along a helical axis extending in a thickness direction.

The in-plane slow axis of the first optically anisotropic layer 12B is parallel to the in-plane slow axis of the second optically anisotropic layer 14B.

The in-plane slow axis of the second optically anisotropic layer 14B is parallel to the in-plane slow axis on the surface of the third optically anisotropic layer 16B on the second optically anisotropic layer 14B side.

The in-plane slow axis on the surface of the third optically anisotropic layer 16B on the fourth optically anisotropic layer 18B side is parallel to the in-plane slow axis on the surface of the fourth optically anisotropic layer 18B on the third optically anisotropic layer 16B side.

Hereinafter, each of those layers will be described in detail.

(First Optically Anisotropic Layer 12B)

The first optically anisotropic layer 12B is a negative A-plate.

The in-plane retardation of the first optically anisotropic layer 12B at a wavelength of 550 nm is not particularly limited, and is preferably 20 to 90 nm and more preferably 20 to 80 nm from the viewpoint that the effect of the present invention is more excellent.

The thickness direction retardation of the first optically anisotropic layer 12B at a wavelength of 550 nm is not particularly limited, and is preferably −45 to −10 nm and more preferably −40 to −10 nm from the viewpoint that the effect of the present invention is more excellent.

The first optically anisotropic layer 12B may exhibit forward wavelength dispersibility (a characteristic that the in-plane retardation decreases as the measurement wavelength increases) or reverse wavelength dispersibility (a characteristic that the in-plane retardation increases as the measurement wavelength increases). The forward wavelength dispersibility and the reverse wavelength dispersibility are preferably exhibited in a visible light range.

The configuration of the first optically anisotropic layer 12B is not particularly limited as long as it is a negative A-plate, and examples thereof include a layer formed by fixing a disk-like liquid crystal compound that is vertically aligned and whose optical axis (axis orthogonal to the disc plane) is arranged in the same direction and a stretching film, among which a layer formed by fixing a disk-like liquid crystal compound that is vertically aligned and whose optical axis (axis orthogonal to the disc plane) is arranged in the same direction is preferable from the viewpoint that the effect of the present invention is more excellent.

The state in which a disk-like liquid crystal compound is vertically aligned means that the disc plane of the disk-like liquid crystal compound is parallel to the thickness direction of the layer. It is not required to be strictly parallel, but an angle formed by the disc plane and the thickness direction of the layer is preferably in a range of 0°±20° and more preferably in a range of 0°±10°.

In addition, the state in which optical axes (axes orthogonal to the disc plane) of the disk-like liquid crystal compound are arranged in the same orientation does not require that the optical axes of the disk-like liquid crystal compound are arranged strictly in the same orientation, but it is intended that, in a case where orientations of the slow axes are measured at any 20 positions in the plane, the maximum difference in slow axis orientation among the slow axis orientations at 20 positions (the difference between two slow axis orientations having the largest difference among the 20 slow axis orientations) is less than 10°.

The type of the disk-like liquid crystal compound used for forming the first optically anisotropic layer 12B is not particularly limited, and examples thereof include known compounds.

The disk-like liquid crystal compound may have a polymerizable group.

The types of polymerizable groups that the disk-like liquid crystal compound may have are as described above.

The first optically anisotropic layer 12B is preferably a layer formed by fixing a disk-like liquid crystal compound having a polymerizable group by means of polymerization.

The in-plane slow axis of the first optically anisotropic layer 12B is parallel to the in-plane slow axis of the second optically anisotropic layer 14B.

The thickness of the first optically anisotropic layer 12B is not particularly limited, and is preferably 10 µm or less, more preferably 0.1 to 5.0 µm, and still more preferably 0.3 to 2.0 µm.

The thickness of the first optically anisotropic layer 12B is intended to refer to an average thickness of the first optically anisotropic layer 12B. The average thickness is obtained by measuring the thicknesses of any five or more points of the first optically anisotropic layer 12B and arithmetically averaging the measured values.

(Second Optically Anisotropic Layer 14B)

The second optically anisotropic layer 14B is a positive A-plate.

The in-plane retardation of the second optically anisotropic layer 14B at a wavelength of 550 nm is not particularly limited, and is preferably 70 to 200 nm and more preferably 80 to 190 nm from the viewpoint that the effect of the present invention is more excellent.

The thickness direction retardation of the second optically anisotropic layer 14B at a wavelength of 550 nm is not particularly limited, and is preferably 35 to 100 nm and more preferably 40 to 95 nm from the viewpoint that the effect of the present invention is more excellent.

The second optically anisotropic layer 14B may exhibit forward wavelength dispersibility (a characteristic that the in-plane retardation decreases as the measurement wavelength increases) or reverse wavelength dispersibility (a characteristic that the in-plane retardation increases as the measurement wavelength increases). The forward wavelength dispersibility and the reverse wavelength dispersibility are preferably exhibited in a visible light range.

The configuration of the second optically anisotropic layer 14B is not particularly limited as long as it is a positive A-plate, and examples thereof include a layer formed by fixing a rod-like liquid crystal compound homogeneously aligned and a stretching film, among which a layer formed by fixing a rod-like liquid crystal compound homogeneously aligned is preferable from the viewpoint that the effect of the present invention is more excellent.

The type of the rod-like liquid crystal compound used for forming the second optically anisotropic layer 14B is not particularly limited, and examples thereof include known compounds.

The rod-like liquid crystal compound may have a polymerizable group.

The types of polymerizable groups that the rod-like liquid crystal compound may have are as described above.

The second optically anisotropic layer 14B is preferably a layer formed by fixing a rod-like liquid crystal compound having a polymerizable group by means of polymerization.

The thickness of the second optically anisotropic layer 14B is not particularly limited, and is preferably 10 µm or less, more preferably 0.1 to 5.0 µm, and still more preferably 0.3 to 2.0 µm.

The thickness of the second optically anisotropic layer 14B is intended to refer to an average thickness of the second optically anisotropic layer 14B. The average thickness is obtained by measuring the thicknesses of any five or more points of the second optically anisotropic layer 14B and arithmetically averaging the measured values.

(Third Optically Anisotropic Layer 16B)

The third optically anisotropic layer 16B is a layer formed by fixing a disk-like liquid crystal compound LC1 twist-aligned along a helical axis extending in a thickness direction.

In a case of forming the third optically anisotropic layer 16B, it is preferable to use at least a disk-like liquid crystal compound and a chiral agent.

The twisted angle of the disk-like liquid crystal compound (twisted angle of the disk-like liquid crystal compound in an alignment direction) is not particularly limited, and is often more than 0° and 360° or less. From the viewpoint that the effect of the present invention is more excellent, the twisted angle of the disk-like liquid crystal compound is preferably within a range of 40°±20° (within a range of 20° to 60°) and more preferably within a range of 40°±15° (within a range of 25° to 55°).

The twisted angle is measured using an AxoScan (polarimeter) device of Axometrics, Inc. and using device analysis software of Axometrics, Inc.

In addition, the expression "disk-like liquid crystal compound is twist-aligned" is intended to mean that the disk-like liquid crystal compound from one main surface to the other main surface of the third optically anisotropic layer 16B is twisted around the thickness direction of the third optically anisotropic layer 16B. Along with this, the alignment direction (in-plane slow axis direction) of the disk-like liquid crystal compound varies depending on the position in the thickness direction of the third optically anisotropic layer 16B.

In the twisted alignment, the disk-like liquid crystal compound is vertically aligned. The state in which the disk-like liquid crystal compound is vertically aligned means that the disc plane of the disk-like liquid crystal compound is parallel to the thickness direction of the third optically anisotropic layer 16B. It is not required to be strictly parallel, and the angle formed by the disc plane and the thickness direction of the third optically anisotropic layer 16B is preferably in a range of 0°±20° and preferably in a range of 0°±10°.

The in-plane slow axis of the second optically anisotropic layer 14B is parallel to the in-plane slow axis on the surface of the third optically anisotropic layer 16B on the second optically anisotropic layer 14B side.

A value of a product $\Delta nd$ of a refractive index anisotropy $\Delta n$ of the third optically anisotropic layer 16B at a wavelength of 550 nm and a thickness d of the third optically anisotropic layer 16B is not particularly limited, and is preferably 50 to 120 nm and more preferably 55 to 115 nm from the viewpoint that the effect of the present invention is more excellent.

The $\Delta nd$ is measured using an AxoScan (polarimeter) device of Axometrics, Inc. and using device analysis software of Axometrics, Inc.

The type of the disk-like liquid crystal compound used for forming the third optically anisotropic layer 16B is not particularly limited, and examples thereof include known compounds.

The disk-like liquid crystal compound may have a polymerizable group.

The types of polymerizable groups that the disk-like liquid crystal compound may have are as described above.

The third optically anisotropic layer 16B is preferably a layer formed by fixing a disk-like liquid crystal compound having a polymerizable group by means of polymerization. More specifically, the third optically anisotropic layer 16B is more preferably a layer formed by fixing a disk-like liquid crystal compound twist-aligned and having a polymerizable group by means of polymerization.

The thickness of the third optically anisotropic layer 16B is not particularly limited, and is preferably 10 μm or less, more preferably 0.1 to 5.0 μm, and still more preferably 0.3 to 2.0 μm.

The thickness of the third optically anisotropic layer 16B is intended to refer to an average thickness of the third optically anisotropic layer 16B. The average thickness is obtained by measuring the thicknesses of any five or more points of the third optically anisotropic layer 16B and arithmetically averaging the measured values.

(Fourth Optically Anisotropic Layer 18B)

The fourth optically anisotropic layer 18B is a layer formed by fixing a rod-like liquid crystal compound LC2 twist-aligned along a helical axis extending in a thickness direction.

The fourth optically anisotropic layer 18B is preferably a layer formed by fixing a so-called chiral nematic phase having a helical structure. In a case of forming the fourth optically anisotropic layer 18B, it is preferable to use at least a liquid crystal compound and a chiral agent.

The twisted angle of the rod-like liquid crystal compound (twisted angle of the liquid crystal compound in an alignment direction) is not particularly limited, and is often more than 0° and 360° or less. From the viewpoint that the effect of the present invention is more excellent, the twisted angle of the rod-like liquid crystal compound is preferably within a range of 40°±20° (within a range of 20° to 60°) and more preferably within a range of 40°±15° (within a range of 25° to 55°).

The twisted angle is measured using an AxoScan (polarimeter) device of Axometrics, Inc. and using device analysis software of Axometrics, Inc.

In addition, the expression "rod-like liquid crystal compound is twist-aligned" is intended to mean that the rod-like liquid crystal compound from one main surface to the other main surface of the fourth optically anisotropic layer 18B is twisted around the thickness direction of the fourth optically anisotropic layer 18B. Along with this, the alignment direction (in-plane slow axis direction) of the rod-like liquid crystal compound varies depending on the position in the thickness direction of the fourth optically anisotropic layer 18B.

In the twisted alignment, the major axis of the rod-like liquid crystal compound is arranged so as to be parallel to the main surface of the fourth optically anisotropic layer 18B. It is not required to be strictly parallel, and the angle formed by the major axis of the rod-like liquid crystal compound and the main surface of the fourth optically anisotropic layer 18B is preferably in a range of 0°±20° and more preferably in a range of 0°±10°.

A value of a product Δnd of a refractive index anisotropy Δn of the fourth optically anisotropic layer 18B at a wavelength of 550 nm and a thickness d of the fourth optically anisotropic layer 18B is not particularly limited, and is preferably 50 to 120 nm and more preferably 55 to 115 nm from the viewpoint that the effect of the present invention is more excellent.

The Δnd is measured using an AxoScan (polarimeter) device of Axometrics, Inc. and using device analysis software of Axometrics, Inc.

The in-plane slow axis on the surface of the third optically anisotropic layer 16B on the fourth optically anisotropic layer 18B side is parallel to the in-plane slow axis on the surface of the fourth optically anisotropic layer 18B on the third optically anisotropic layer 16B side.

The type of the rod-like liquid crystal compound used for forming the fourth optically anisotropic layer 18B is not particularly limited, and examples thereof include known compounds.

The rod-like liquid crystal compound may have a polymerizable group.

The types of polymerizable groups that the rod-like liquid crystal compound may have are as described above.

The fourth optically anisotropic layer 18B is preferably a layer formed by fixing a rod-like liquid crystal compound having a polymerizable group by means of polymerization. More specifically, the fourth optically anisotropic layer 18B is more preferably a layer formed by fixing a rod-like liquid crystal compound twist-aligned and having a polymerizable group by means of polymerization.

The thickness of the fourth optically anisotropic layer 18B is not particularly limited, and is preferably 10 μm or less, more preferably 0.1 to 5.0 μm, and still more preferably 0.3 to 2.0 μm.

The thickness of the fourth optically anisotropic layer 18B is intended to refer to an average thickness of the fourth optically anisotropic layer 18B. The average thickness is obtained by measuring the thicknesses of any five or more points of the fourth optically anisotropic layer 18B and arithmetically averaging the measured values.

(Other Members)

The phase difference film 10B may include members other than the above-mentioned first optically anisotropic layer 12B to fourth optically anisotropic layer 18B.

Examples of other members include the other members described in the above-mentioned first embodiment of the phase difference film.

The methods for producing the first optically anisotropic layer 12B to the fourth optically anisotropic layer 18B are not particularly limited, and the above-mentioned methods for producing the first optically anisotropic layer 12A to the fourth optically anisotropic layer 18A can be mentioned.

Second Embodiment of Circularly Polarizing Plate

The second embodiment of the phase difference film according to the embodiment of the present invention can be used as a circularly polarizing plate in combination with a polarizer.

The circularly polarizing plate according to the embodiment of the present invention having the above configuration is suitably used for antireflection applications of a display device such as a liquid crystal display device (LCD), a plasma display panel (PDP), an electroluminescent display (ELD), or a cathode tube display device (CRT).

The polarizer is as described in the first embodiment.

Figure 6:
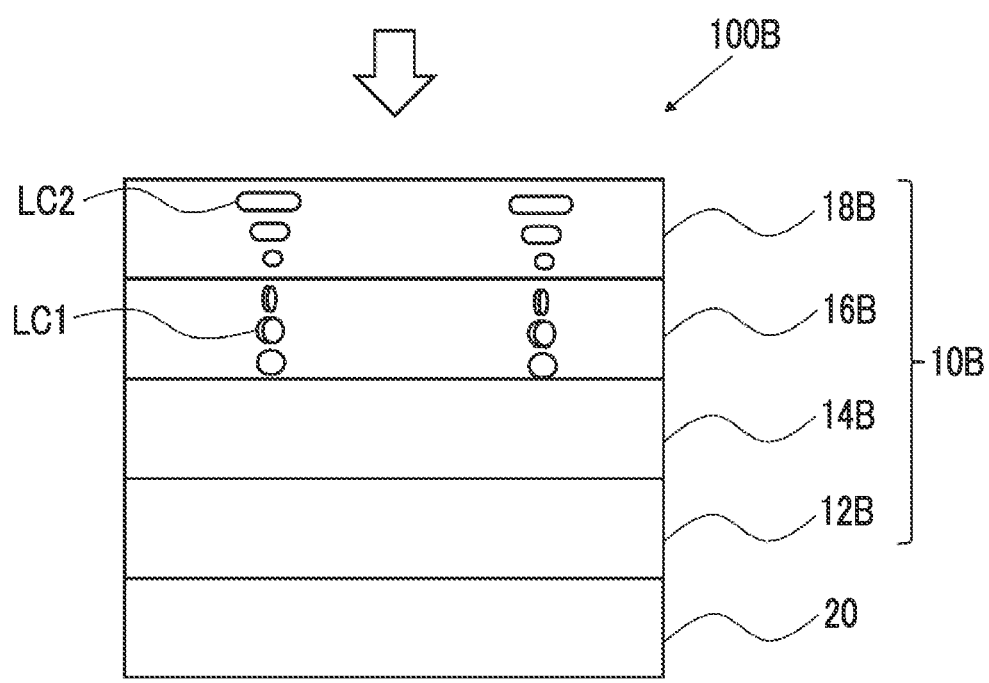
FIG. 6 is an example of a schematic cross-sectional view of a second embodiment of the circularly polarizing plate of the present invention.
Figure 7:
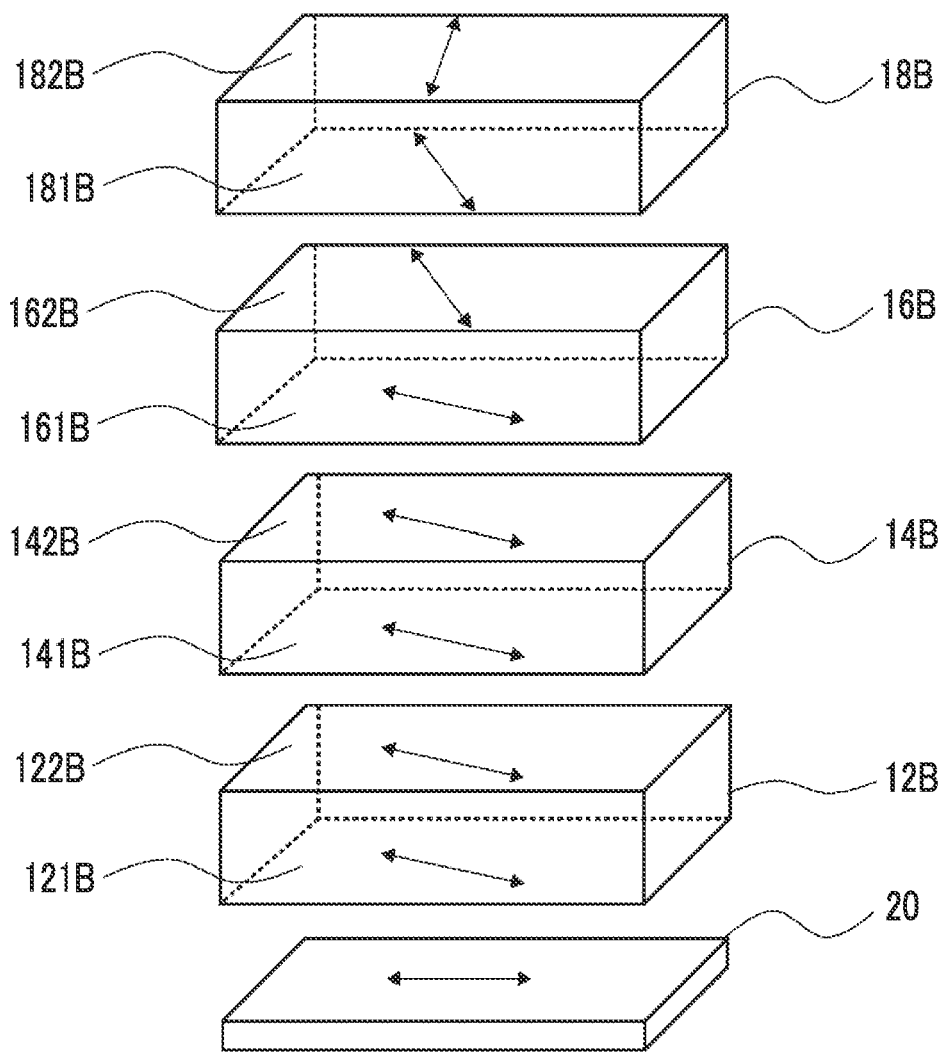
FIG. 7 is a view showing a relationship between an absorption axis of a polarizer and an in-plane slow axis of each of a first optically anisotropic layer to a fourth optically anisotropic layer in the second embodiment of the circularly polarizing plate of the present invention.

FIG. 6 shows a schematic cross-sectional view of an embodiment of a circularly polarizing plate 100B. In addition, FIG. 7 is a view showing a relationship between the absorption axis of the polarizer 20 and the in-plane slow axis of each of the first optically anisotropic layer 12B to the fourth optically anisotropic layer 18B in the circularly polarizing plate 100B shown in FIG. 6. In FIG. 7, the arrow in the polarizer 20 indicates an absorption axis, and the arrow in the first optically anisotropic layer 12B to the fourth optically anisotropic layer 18B indicates an in-plane slow axis in each layer.

Figure 8:
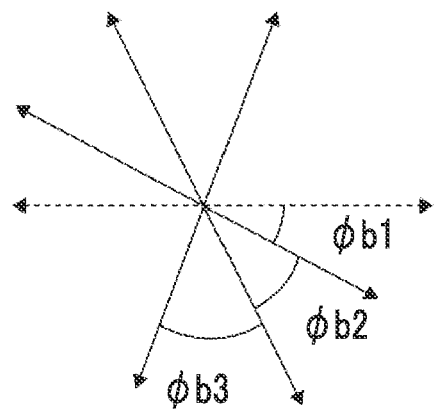
FIG. 8 is a schematic view showing a relationship of an angle between the absorption axis of the polarizer and the in-plane slow axis of each of the first optically anisotropic layer to the fourth optically anisotropic layer, upon observation from the direction of a white arrow in FIG. 6.

In addition, FIG. 8 is a view showing a relationship of the angle between the absorption axis (broken line) of the polarizer 20 and the in-plane slow axis (solid line) of each of the first optically anisotropic layer 12B to the fourth optically anisotropic layer 18B, upon observation from the white arrow in FIG. 6.

The rotation angle of the in-plane slow axis is represented by a positive angle value in a counterclockwise direction and a negative angle value in a clockwise direction, with reference to the absorption axis of the polarizer 20 (0°), upon observation from the white arrow in FIG. 6. In addition, whether the twisted direction is a right-handed twist (clockwise) or a left-handed twist (counterclockwise) is determined with reference to the in-plane slow axis on the surface of the front side (the side opposite to the polarizer 20 side) in the third optically anisotropic layer 16B and the fourth optically anisotropic layer 18B, upon observation from the white arrow in FIG. 6.

As shown in FIG. 6, the circularly polarizing plate 100B includes the polarizer 20, the first optically anisotropic layer 12B, the second optically anisotropic layer 14B, the third optically anisotropic layer 16B, and the fourth optically anisotropic layer 18B in this order.

As shown in FIG. 7 and FIG. 8, an angle φb1 formed by the absorption axis of the polarizer 20 and the in-plane slow axis of the first optically anisotropic layer 12B is 15°. More specifically, the in-plane slow axis of the first optically anisotropic layer 12B is rotated by −15° (clockwise 15°) with respect to the absorption axis of the polarizer 20. Although FIG. 7 and FIG. 8 show an aspect in which the in-plane slow axis of the first optically anisotropic layer 12B is at a position of −15°, the present invention is not limited to this aspect. The in-plane slow axis of the first optically anisotropic layer 12B is preferably within a range of −15°±13°. That is, the angle formed by the absorption axis of the polarizer 20 and the in-plane slow axis of the first optically anisotropic layer 12B is preferably within a range of 15°±13°.

As shown in FIG. 7, in the first optically anisotropic layer 12B, the in-plane slow axis on a surface 121B of the first optically anisotropic layer 12B on the polarizer 20 side is parallel to the in-plane slow axis on a surface 122B of the first optically anisotropic layer 12B on the second optically anisotropic layer 14B side.

As shown in FIG. 7 and FIG. 8, the in-plane slow axis of the first optically anisotropic layer 12B is parallel to the in-plane slow axis of the second optically anisotropic layer 14B.

In addition, as shown in FIG. 7, in the second optically anisotropic layer 14B, the in-plane slow axis on a surface 141B of the second optically anisotropic layer 14B on the polarizer 20 side is parallel to the in-plane slow axis on a surface 142B of the second optically anisotropic layer 14B on the third optically anisotropic layer 16B side.

In addition, as shown in FIG. 7, the in-plane slow axis on the surface 142B of the second optically anisotropic layer 14B on the third optically anisotropic layer 16B side is parallel to the in-plane slow axis on a surface 161B of the third optically anisotropic layer 16B on the second optically anisotropic layer 14B side.

As described above, the third optically anisotropic layer 16B is a layer formed by fixing a disk-like liquid crystal compound twist-aligned along a helical axis extending in a thickness direction. Therefore, as shown in FIG. 7 and FIG. 8, the in-plane slow axis on the surface 161B of the third optically anisotropic layer 16B on the second optically anisotropic layer 14B side and the in-plane slow axis on a surface 162B of the third optically anisotropic layer 16B opposite to the second optically anisotropic layer 14B side form the above-mentioned twisted angle (40° in FIG. 7).

That is, an angle φb2 formed by the in-plane slow axis on the surface 161B of the third optically anisotropic layer 16B on the second optically anisotropic layer 14B side and the in-plane slow axis on the surface 162B of the third optically anisotropic layer 16B opposite to the second optically anisotropic layer 14B side is 40°. More specifically, the twisted direction of the disk-like liquid crystal compound in the third optically anisotropic layer 16B is a left-handed twist (counterclockwise), and the twisted angle is 40°. Therefore, the angle formed by the absorption axis of the polarizer 20 and the in-plane slow axis on the surface 162B of the third optically anisotropic layer 16B opposite to the second optically anisotropic layer 14B side is 55°.

Although FIG. 7 and FIG. 8 show an aspect in which the twisted angle of the disk-like liquid crystal compound in the third optically anisotropic layer 16B is 40°, the present invention is not limited to this aspect. The twisted angle of the disk-like liquid crystal compound is preferably within a range of 40°±20°. That is, the angle formed by the in-plane slow axis on the surface 161B of the third optically anisotropic layer 16B on the second optically anisotropic layer 14B side and the in-plane slow axis on the surface 162B of the third optically anisotropic layer 16B opposite to the second optically anisotropic layer 14B side is preferably within a range of 40°±20°.

In addition, as shown in FIG. 7, the in-plane slow axis on the surface 162B of the third optically anisotropic layer 16B on the fourth optically anisotropic layer 18B side is parallel to the in-plane slow axis on a surface 181B of the fourth optically anisotropic layer 18B on the third optically anisotropic layer 16B side.

As described above, the fourth optically anisotropic layer 18B is a layer formed by fixing a rod-like liquid crystal compound twist-aligned along a helical axis extending in a thickness direction. Therefore, as shown in FIG. 7 and FIG. 8, the in-plane slow axis on the surface 181B of the fourth optically anisotropic layer 18B on the polarizer 20 side and the in-plane slow axis on a surface 182B of the fourth optically anisotropic layer 18B opposite to the polarizer 20 side form the above-mentioned twisted angle (40° in FIG. 7). That is, an angle φb3 formed by the in-plane slow axis on the surface 181B of the fourth optically anisotropic layer 18B on the polarizer 20 side and the in-plane slow axis on the surface 182B of the fourth optically anisotropic layer 18B opposite to the polarizer 20 side is 40°. More specifically, the twisted direction of the rod-like liquid crystal compound in the fourth optically anisotropic layer 18B is a left-handed twist (counterclockwise), and the twisted angle is 40°. Therefore, the angle formed by the absorption axis of the polarizer 20 and the in-plane slow axis on the surface 182B of the fourth optically anisotropic layer 18B opposite to the third optically anisotropic layer 16B side is 95°.

Although FIG. 7 and FIG. 8 show an aspect in which the twisted angle of the rod-like liquid crystal compound in the fourth optically anisotropic layer 18B is 40°, the present invention is not limited to this aspect. The twisted angle of the rod-like liquid crystal compound may be within a range of 40°±20°. That is, the angle formed by the in-plane slow axis on the surface 181B of the fourth optically anisotropic layer 18B on the third optically anisotropic layer 16B side and the in-plane slow axis on the surface 182B of the fourth optically anisotropic layer 18B opposite to the third optically anisotropic layer 16B side is preferably within a range of 40°±20°.

As described above, in the aspect of FIG. 7 and FIG. 8, the in-plane slow axes of the first optically anisotropic layer 12B and the second optically anisotropic layer 14B are rotated clockwise by 15°, the twisted direction of the disk-like liquid crystal compound in the third optically anisotropic layer 16B is counterclockwise (left-handed twist), and the twisted direction of the rod-like liquid crystal compound in the fourth optically anisotropic layer 18B is counterclockwise (left-handed twist), with reference to the absorption axis of the polarizer 20, upon observation of the circularly polarizing plate 100B from the phase difference film 10B side.

In FIG. 7 and FIG. 8, the aspect in which the twisted direction of the liquid crystal compound is counterclockwise is described in detail, but an aspect in which the twisted direction of the liquid crystal compound is clockwise may be configured as long as the relationship of a predetermined angle is satisfied. More specifically, it may be an aspect in which the in-plane slow axes of the first optically anisotropic layer 12B and the second optically anisotropic layer 14B are rotated counterclockwise by 15°, the twisted direction of the disk-like liquid crystal compound in the third optically anisotropic layer 16B is clockwise (right-handed twist), and the twisted direction of the rod-like liquid crystal compound in the fourth optically anisotropic layer 18B is clockwise (right-handed twist), with reference to the absorption axis of the polarizer 20, upon observation of the circularly polarizing plate 100B from the phase difference film 10B side.

That is, in the circularly polarizing plate including the second embodiment of the phase difference film, in a case where the in-plane slow axes of the first optically anisotropic layer and the second optically anisotropic layer are rotated clockwise within a range of 15°±13° (preferably 15°±10° with reference to the absorption axis of the polarizer, upon observation of the circularly polarizing plate from the phase difference film side, it is preferable that the twisted direction of the liquid crystal compound in the third optically anisotropic layer is counterclockwise with reference to the in-plane slow axis on the surface of the third optically anisotropic layer on the fourth optically anisotropic layer side, and the twisted direction of the liquid crystal compound in the fourth optically anisotropic layer is counterclockwise with reference to the in-plane slow axis on the surface of the fourth optically anisotropic layer opposite to the third optically anisotropic layer side.

In addition, in the circularly polarizing plate including the second embodiment of the phase difference film, in a case where the in-plane slow axes of the first optically anisotropic layer and the second optically anisotropic layer are rotated counterclockwise within a range of 15°±13° (preferably 15°±10° with reference to the absorption axis of the polarizer, upon observation of the circularly polarizing plate from the phase difference film side, it is preferable that the twisted direction of the liquid crystal compound in the third optically anisotropic layer is clockwise with reference to the in-plane slow axis on the surface of the third optically anisotropic layer on the fourth optically anisotropic layer side, and the twisted direction of the liquid crystal compound in the fourth optically anisotropic layer is clockwise with reference to the in-plane slow axis on the surface of the fourth optically anisotropic layer opposite to the third optically anisotropic layer side.

The circularly polarizing plate may have a member other than the phase difference film and the polarizer.

The circularly polarizing plate may have an adhesion layer between the phase difference film and the polarizer.

Examples of the adhesion layer include known pressure sensitive adhesive layers and adhesive layers.

The method for producing the above-described circularly polarizing plate is not particularly limited and may be, for example, a known method.

For example, there is a method of bonding a polarizer and a phase difference film through an adhesion layer.

Third Embodiment of Phase Difference Film

Figure 9:
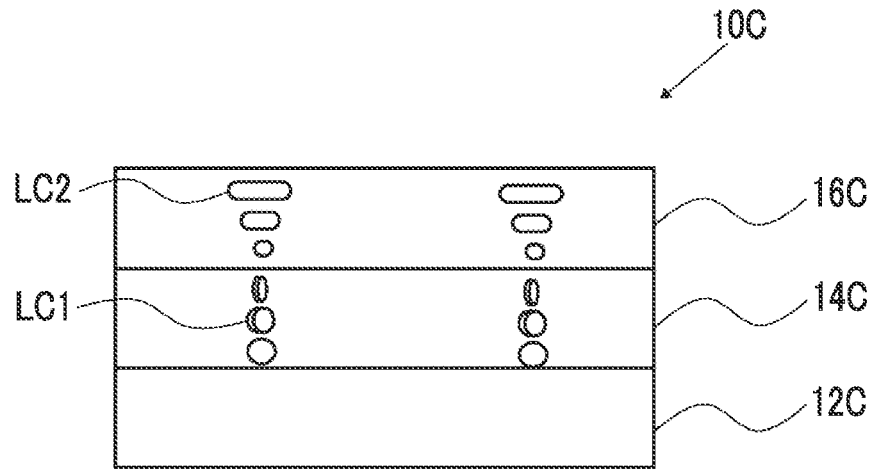
FIG. 9 is an example of a schematic cross-sectional view of a third embodiment of the phase difference film of the present invention.

Hereinafter, the third embodiment of the phase difference film according to the embodiment of the present invention will be described with reference to the accompanying drawings. FIG. 9 shows a schematic cross-sectional view of the third embodiment of the phase difference film according to the embodiment of the present invention.

A phase difference film 10C has a first optically anisotropic layer 12C, a second optically anisotropic layer 14C, and a third optically anisotropic layer 16C in this order.

The first optically anisotropic layer 12C is a positive A-plate, the second optically anisotropic layer 14C is a layer formed by fixing a disk-like liquid crystal compound LC1 twist-aligned along a helical axis extending in a thickness direction, and the third optically anisotropic layer 16C is a layer formed by fixing a rod-like liquid crystal compound LC2 twist-aligned along a helical axis extending in a thickness direction.

The in-plane slow axis of the first optically anisotropic layer 12C is parallel to the in-plane slow axis on the surface of the second optically anisotropic layer 14C on the first optically anisotropic layer 12C side.

The in-plane slow axis on the surface of the second optically anisotropic layer 14C on the third optically anisotropic layer 16C side is parallel to the in-plane slow axis on the surface of the third optically anisotropic layer 16C on the second optically anisotropic layer 14C side.

Hereinafter, each of those layers will be described in detail.

(First Optically Anisotropic Layer 12C)

The first optically anisotropic layer 12C is a positive A-plate.

The in-plane retardation of the first optically anisotropic layer 12C at a wavelength of 550 nm is not particularly limited, and is preferably 120 to 240 nm and more preferably 130 to 230 nm from the viewpoint that the effect of the present invention is more excellent.

The thickness direction retardation of the first optically anisotropic layer 12C at a wavelength of 550 nm is not particularly limited, and is preferably 60 to 120 nm and more preferably 65 to 115 nm from the viewpoint that the effect of the present invention is more excellent.

The first optically anisotropic layer 12C may exhibit forward wavelength dispersibility (a characteristic that the in-plane retardation decreases as the measurement wavelength increases) or reverse wavelength dispersibility (a characteristic that the in-plane retardation increases as the measurement wavelength increases). The forward wavelength dispersibility and the reverse wavelength dispersibility are preferably exhibited in a visible light range.

The configuration of the first optically anisotropic layer 12C is not particularly limited as long as it is a positive A-plate, and examples thereof include a layer formed by fixing a rod-like liquid crystal compound homogeneously aligned and a stretching film, among which a layer formed by fixing a rod-like liquid crystal compound homogeneously aligned is preferable from the viewpoint that the effect of the present invention is more excellent.

The type of the rod-like liquid crystal compound used for forming the first optically anisotropic layer 12C is not particularly limited, and examples thereof include known compounds.

The rod-like liquid crystal compound may have a polymerizable group.

The types of polymerizable groups that the rod-like liquid crystal compound may have are as described above.

The first optically anisotropic layer 12C is preferably a layer formed by fixing a rod-like liquid crystal compound having a polymerizable group by means of polymerization.

The thickness of the first optically anisotropic layer 12C is not particularly limited, and is preferably 10 μm or less, more preferably 0.1 to 5.0 μm, and still more preferably 0.3 to 2.0 μm.

The thickness of the first optically anisotropic layer 12C is intended to refer to an average thickness of the first optically anisotropic layer 12C. The average thickness is obtained by measuring the thicknesses of any five or more points of the first optically anisotropic layer 12C and arithmetically averaging the measured values.

(Second Optically Anisotropic Layer 14C)

The second optically anisotropic layer 14C is a layer formed by fixing a disk-like liquid crystal compound LC1 twist-aligned along a helical axis extending in a thickness direction.

In a case of forming the second optically anisotropic layer 14C, it is preferable to use at least a disk-like liquid crystal compound and a chiral agent.

The twisted angle of the disk-like liquid crystal compound (twisted angle of the disk-like liquid crystal compound in an alignment direction) is not particularly limited, and is often more than 0° and 360° or less. From the viewpoint that the effect of the present invention is more excellent, the twisted angle of the disk-like liquid crystal compound is preferably within a range of 80°±30° (within a range of 50° to 110°) and more preferably within a range of 80°±20° (within a range of 60° to 100°).

The twisted angle is measured using an AxoScan (polarimeter) device of Axometrics, Inc. and using device analysis software of Axometrics, Inc.

In addition, the expression "disk-like liquid crystal compound is twist-aligned" is intended to mean that the disk-like liquid crystal compound from one main surface to the other main surface of the second optically anisotropic layer 14C is twisted around the thickness direction of the second optically anisotropic layer 14C. Along with this, the alignment direction (in-plane slow axis direction) of the disk-like liquid crystal compound varies depending on the position in the thickness direction of the second optically anisotropic layer 14C.

In the twisted alignment, the disk-like liquid crystal compound is vertically aligned. The state in which the disk-like liquid crystal compound is vertically aligned means that the disc plane of the disk-like liquid crystal compound is parallel to the thickness direction of the second optically anisotropic layer 14C. It is not required to be strictly parallel, and the angle formed by the disc plane and the thickness direction of the second optically anisotropic layer 14C is preferably in a range of 0°±20° and preferably in a range of 0°±10°.

The in-plane slow axis of the first optically anisotropic layer 12C is parallel to the in-plane slow axis on the surface of the second optically anisotropic layer 14C on the first optically anisotropic layer 12C side.

A value of a product $\Delta nd$ of a refractive index anisotropy $\Delta n$ of the second optically anisotropic layer 14C at a wavelength of 550 nm and a thickness d of the second optically anisotropic layer 14C is not particularly limited, and is preferably 120 to 240 nm and more preferably 130 to 230 nm from the viewpoint that the effect of the present invention is more excellent.

The $\Delta nd$ is measured using an AxoScan (polarimeter) device of Axometrics, Inc. and using device analysis software of Axometrics, Inc.

The type of the disk-like liquid crystal compound used for forming the second optically anisotropic layer 14C is not particularly limited, and examples thereof include known compounds.

The disk-like liquid crystal compound may have a polymerizable group.

The types of polymerizable groups that the disk-like liquid crystal compound may have are as described above.

The second optically anisotropic layer 14C is preferably a layer formed by fixing a disk-like liquid crystal compound having a polymerizable group by means of polymerization. More specifically, the second optically anisotropic layer 14C is more preferably a layer formed by fixing a disk-like liquid crystal compound twist-aligned and having a polymerizable group by means of polymerization.

The thickness of the second optically anisotropic layer 14C is not particularly limited, and is preferably 10 μm or less, more preferably 0.1 to 5.0 μm, and still more preferably 0.3 to 2.0 μm.

The thickness of the second optically anisotropic layer 14C is intended to refer to an average thickness of the second optically anisotropic layer 14C. The average thickness is obtained by measuring the thicknesses of any five or more points of the second optically anisotropic layer 14C and arithmetically averaging the measured values.

(Third Optically Anisotropic Layer 16C)

The third optically anisotropic layer 16C is a layer formed by fixing a rod-like liquid crystal compound LC2 twist-aligned along a helical axis extending in a thickness direction.

The third optically anisotropic layer 16C is preferably a layer formed by fixing a so-called chiral nematic phase having a helical structure. In a case of forming the third optically anisotropic layer 16C, it is preferable to use at least a liquid crystal compound and a chiral agent.

The twisted angle of the rod-like liquid crystal compound (twisted angle of the liquid crystal compound in an alignment direction) is not particularly limited, and is often more than 0° and 360° or less. From the viewpoint that the effect of the present invention is more excellent, the twisted angle of the rod-like liquid crystal compound is preferably within a range of 175°±30° (within a range of 145° to 205°) and more preferably within a range of 175°±20° (within a range of 155° to 195°).

The twisted angle is measured using an AxoScan (polarimeter) device of Axometrics, Inc. and using device analysis software of Axometrics, Inc.

In addition, the expression "rod-like liquid crystal compound is twist-aligned" is intended to mean that the rod-like liquid crystal compound from one main surface to the other main surface of the third optically anisotropic layer 16C is twisted around the thickness direction of the third optically anisotropic layer 16C. Along with this, the alignment direction (in-plane slow axis direction) of the rod-like liquid crystal compound varies depending on the position in the thickness direction of the third optically anisotropic layer 16C.

In the twisted alignment, the major axis of the rod-like liquid crystal compound is arranged so as to be parallel to the main surface of the third optically anisotropic layer 16C. It is not required to be strictly parallel, and the angle formed by the major axis of the rod-like liquid crystal compound and the main surface of the third optically anisotropic layer 16C is preferably in a range of 0°±20° and more preferably in a range of 0°±10°.

A value of a product Δnd of a refractive index anisotropy Δn of the third optically anisotropic layer 16C at a wavelength of 550 nm and a thickness d of the third optically anisotropic layer 16C is not particularly limited, and is preferably 70 to 190 nm and more preferably 80 to 180 nm from the viewpoint that the effect of the present invention is more excellent.

The Δnd is measured using an AxoScan (polarimeter) device of Axometrics, Inc. and using device analysis software of Axometrics, Inc.

The in-plane slow axis on the surface of the second optically anisotropic layer 14C on the third optically anisotropic layer 16C side is parallel to the in-plane slow axis on the surface of the third optically anisotropic layer 16C on the second optically anisotropic layer 14C side. In the aspect shown in FIG. 9, the in-plane slow axis on the surface of the second optically anisotropic layer 14C on the third optically anisotropic layer 16C side is parallel to the in-plane slow axis on the surface of the third optically anisotropic layer 16C on the second optically anisotropic layer 14C side, but the present embodiment is not limited to the above aspect. The in-plane slow axis on the surface of the second optically anisotropic layer 14C on the third optically anisotropic layer 16C side may not be parallel to the in-plane slow axis on the surface of the third optically anisotropic layer 16C on the second optically anisotropic layer 14C side.

The type of the rod-like liquid crystal compound used for forming the third optically anisotropic layer 16C is not particularly limited, and examples thereof include known compounds.

The rod-like liquid crystal compound may have a polymerizable group.

The types of polymerizable groups that the rod-like liquid crystal compound may have are as described above.

The third optically anisotropic layer 16C is preferably a layer formed by fixing a rod-like liquid crystal compound having a polymerizable group by means of polymerization. More specifically, the third optically anisotropic layer 16C is more preferably a layer formed by fixing a rod-like liquid crystal compound twist-aligned and having a polymerizable group by means of polymerization.

The thickness of the third optically anisotropic layer 16C is not particularly limited, and is preferably 10 μm or less, more preferably 0.1 to 5.0 μm, and still more preferably 0.3 to 2.0 μm.

The thickness of the third optically anisotropic layer 16C is intended to refer to an average thickness of the third optically anisotropic layer 16C. The average thickness is obtained by measuring the thicknesses of any five or more points of the third optically anisotropic layer 16C and arithmetically averaging the measured values.

(Other Members)

The phase difference film 10C may include members other than the above-mentioned first optically anisotropic layer 12C to third optically anisotropic layer 16C.

Examples of other members include the other members described in the above-mentioned first embodiment of the phase difference film.

The methods for producing the first optically anisotropic layer 12C to the third optically anisotropic layer 16C are not particularly limited, and the above-mentioned methods for producing the first optically anisotropic layer 12A to the fourth optically anisotropic layer 18A can be mentioned.

Third Embodiment of Circularly Polarizing Plate

The third embodiment of the phase difference film according to the embodiment of the present invention can be used as a circularly polarizing plate in combination with a polarizer.

The circularly polarizing plate according to the embodiment of the present invention having the above-described configuration is suitably used for antireflection applications of a display device such as a liquid crystal display device (LCD), a plasma display panel (PDP), an electroluminescent display (ELD), or a cathode tube display device (CRT).

The polarizer is as described in the first embodiment.

Figure 10:
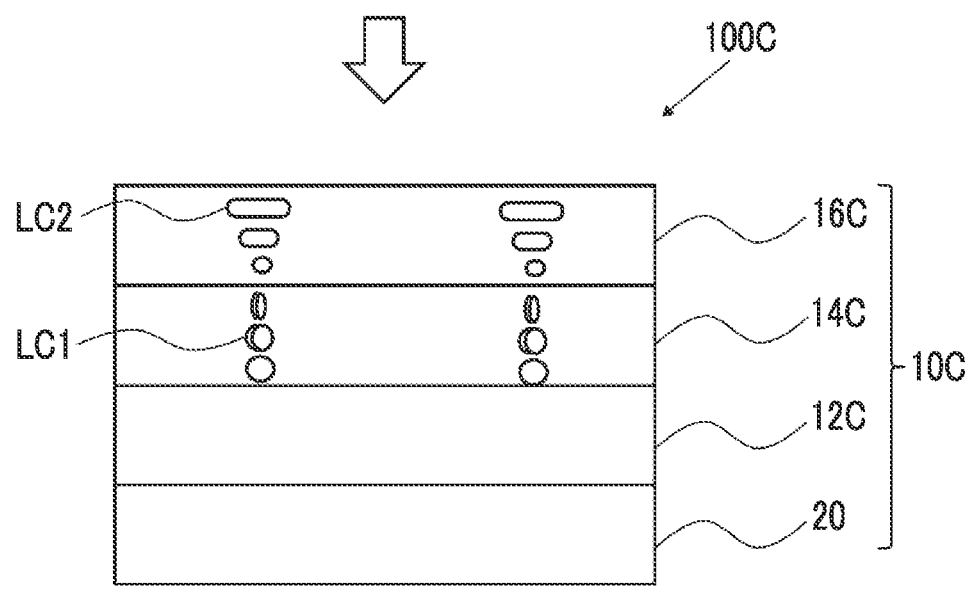
FIG. 10 is an example of a schematic cross-sectional view of a third embodiment of the circularly polarizing plate of the present invention.
Figure 11:
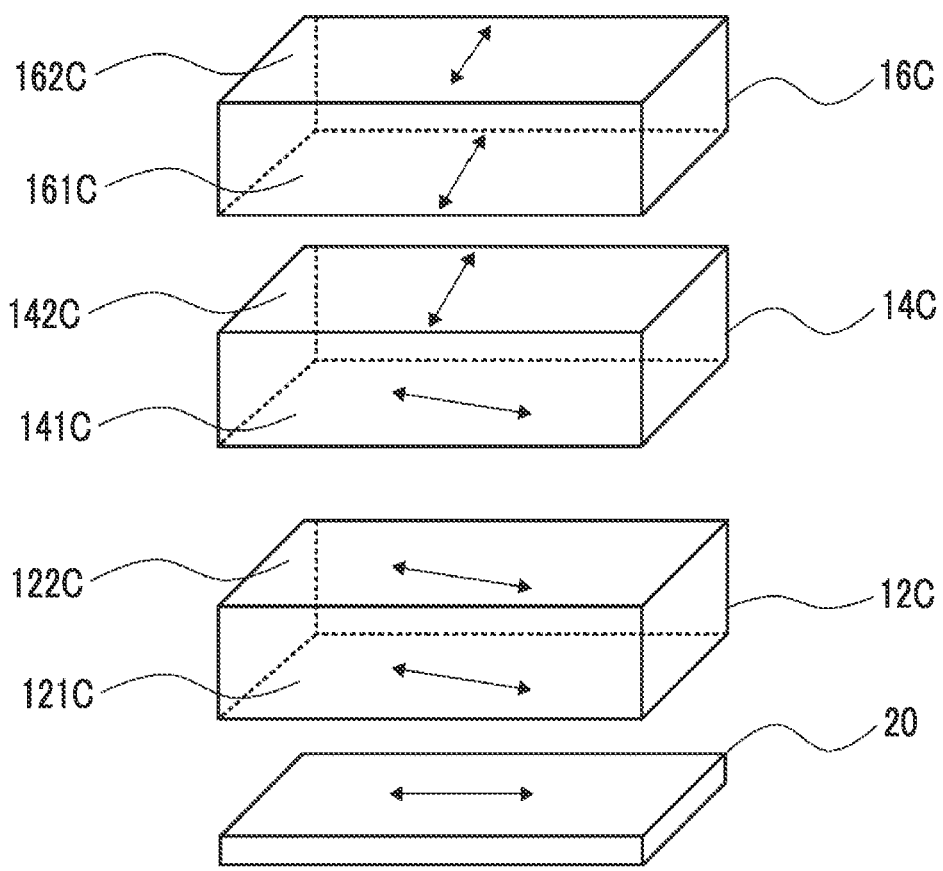
FIG. 11 is a view showing a relationship between an absorption axis of a polarizer and an in-plane slow axis of each of a first optically anisotropic layer to a third optically anisotropic layer in the third embodiment of the circularly polarizing plate of the present invention.

FIG. 10 shows a schematic cross-sectional view of an embodiment of a circularly polarizing plate 100C. In addition, FIG. 11 is a view showing a relationship between the absorption axis of the polarizer 20 and the in-plane slow axis of each of the first optically anisotropic layer 12C to the third optically anisotropic layer 16C in the circularly polarizing plate 100C shown in FIG. 10. In FIG. 11, the arrow in the polarizer 20 indicates an absorption axis, and the arrow in the first optically anisotropic layer 12C to the third optically anisotropic layer 16C indicates an in-plane slow axis in each layer.

Figure 12:
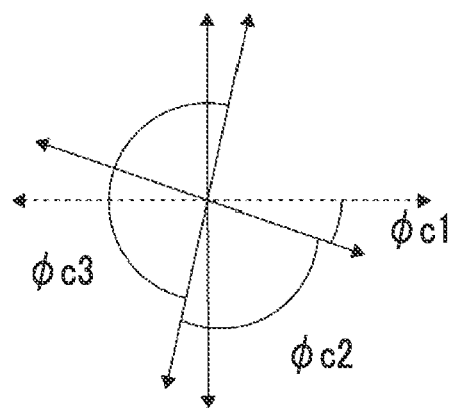
FIG. 12 is a schematic view showing a relationship of an angle between the absorption axis of the polarizer and the in-plane slow axis of each of the first optically anisotropic layer to the third optically anisotropic layer, upon observation from the direction of a white arrow in FIG. 10.

In addition, FIG. 12 is a view showing a relationship of the angle between the absorption axis (broken line) of the polarizer 20 and the in-plane slow axis (solid line) of each of the first optically anisotropic layer 12C to the third optically anisotropic layer 16C, upon observation from the white arrow in FIG. 10.

The rotation angle of the in-plane slow axis is represented by a positive angle value in a counterclockwise direction and a negative angle value in a clockwise direction, with reference to the absorption axis of the polarizer 20) (0°), upon observation from the white arrow in FIG. 10. In addition, whether the twisted direction is a right-handed twist (clockwise) or a left-handed twist (counterclockwise) is determined with reference to the in-plane slow axis on the surface of the front side (the side opposite to the polarizer 20 side) in the second optically anisotropic layer 14C and the third optically anisotropic layer 16C, upon observation from the white arrow in FIG. 10.

As shown in FIG. 10, the circularly polarizing plate 100C includes the polarizer 20, the first optically anisotropic layer 12C, the second optically anisotropic layer 14C, and the third optically anisotropic layer 16C in this order.

As shown in FIG. 11 and FIG. 12, an angle φc1 formed by the absorption axis of the polarizer 20 and the in-plane slow axis of the first optically anisotropic layer 12C is 15°. More specifically, the in-plane slow axis of the first optically anisotropic layer 12C is rotated by −15° (clockwise 15°) with respect to the absorption axis of the polarizer 20. Although FIG. 11 and FIG. 12 show an aspect in which the in-plane slow axis of the first optically anisotropic layer 12C is at a position of −15°, the present invention is not limited to this aspect. The in-plane slow axis of the first optically anisotropic layer 12C is preferably within a range of −15°±13°. That is, the angle formed by the absorption axis of the polarizer 20 and the in-plane slow axis of the first optically anisotropic layer 12C is preferably within a range of 15°±13°.

As shown in FIG. 11, in the first optically anisotropic layer 12C, the in-plane slow axis on a surface 121C of the first optically anisotropic layer 12C on the polarizer 20 side is parallel to the in-plane slow axis on a surface 122C of the first optically anisotropic layer 12C on the second optically anisotropic layer 14C side.

As shown in FIG. 11, the in-plane slow axis on the surface 122C of the first optically anisotropic layer 12C on the second optically anisotropic layer 14C side is parallel to the in-plane slow axis on a surface 141C of the second optically anisotropic layer 14C on the first optically anisotropic layer 12C side.

As described above, the second optically anisotropic layer 14C is a layer formed by fixing a disk-like liquid crystal compound twist-aligned along a helical axis extending in a thickness direction. Therefore, as shown in FIG. 11 and FIG. 12, the in-plane slow axis on the surface 141C of the second optically anisotropic layer 14C on the first optically anisotropic layer 12C side and the in-plane slow axis on a surface 142C of the second optically anisotropic layer 14C opposite to the first optically anisotropic layer 12C side form the above-mentioned twisted angle (80° in FIG. 11). That is, an angle φc2 formed by the in-plane slow axis on the surface 141C of the second optically anisotropic layer 14C on the first optically anisotropic layer 12C side and the in-plane slow axis on the surface 142C of the second optically anisotropic layer 14C opposite to the first optically anisotropic layer 12C side is 80°. More specifically, the twisted direction of the disk-like liquid crystal compound in the second optically anisotropic layer 14C is a left-handed twist (counterclockwise), and the twisted angle is 80°. Therefore, the angle formed by the absorption axis of the polarizer 20 and the in-plane slow axis on the surface 142C of the second optically anisotropic layer 14C opposite to the polarizer 20 side is 95°.

Although FIG. 11 and FIG. 12 show an aspect in which the twisted angle of the disk-like liquid crystal compound in the second optically anisotropic layer 14C is 80°, the present invention is not limited to this aspect. The twisted angle of the disk-like liquid crystal compound is preferably within a range of 80°±30°. That is, the angle formed by the in-plane slow axis on the surface 141C of the second optically anisotropic layer 14C on the first optically anisotropic layer 12C side and the in-plane slow axis on the surface 142C of the second optically anisotropic layer 14C opposite to the first optically anisotropic layer 12C side is preferably within a range of 80°±30°.

In addition, as shown in FIG. 11, the in-plane slow axis on the surface 142C of the second optically anisotropic layer 14C on the third optically anisotropic layer 16C side is parallel to the in-plane slow axis on a surface 161C of the third optically anisotropic layer 16C on the second optically anisotropic layer 14C side.

As described above, the third optically anisotropic layer 16C is a layer formed by fixing a rod-like liquid crystal compound twist-aligned along a helical axis extending in a thickness direction. Therefore, as shown in FIG. 11 and FIG. 12, the in-plane slow axis on the surface 161C of the third optically anisotropic layer 16C on the second optically anisotropic layer 14C side and the in-plane slow axis on a surface 162C of the third optically anisotropic layer 16C opposite to the second optically anisotropic layer 14C side form the above-mentioned twisted angle (175° in FIG. 11). That is, an angle φc3 formed by the in-plane slow axis on the surface 161C of the third optically anisotropic layer 16C on the second optically anisotropic layer 14C side and the in-plane slow axis on the surface 162C of the third optically anisotropic layer 16C opposite to the second optically anisotropic layer 14C side is 175°. More specifically, the twisted direction of the rod-like liquid crystal compound in the third optically anisotropic layer 16C is a left-handed twist (counterclockwise), and the twisted angle is 175°. Therefore, the angle formed by the absorption axis of the polarizer 20 and the in-plane slow axis on the surface 162C of the third optically anisotropic layer 16C opposite to the second optically anisotropic layer 14C side is 270°.

Although FIG. 11 and FIG. 12 show an aspect in which the twisted angle of the rod-like liquid crystal compound in the third optically anisotropic layer 16C is 175°, the present invention is not limited to this aspect. The twisted angle of the rod-like liquid crystal compound is preferably within a range of 175°±30°. That is, the angle formed by the in-plane slow axis on the surface 161C of the third optically anisotropic layer 16C on the second optically anisotropic layer 14C side and the in-plane slow axis on the surface 162C of the third optically anisotropic layer 16C opposite to the second optically anisotropic layer 14C side is preferably within a range of 175°±30°.

As described above, in the aspect of FIG. 11 and FIG. 12, the in-plane slow axis of the first optically anisotropic layer 12C is rotated clockwise by 15°, the twisted direction of the disk-like liquid crystal compound in the second optically anisotropic layer 14C is counterclockwise (left-handed twist), and the twisted direction of the rod-like liquid crystal compound in the third optically anisotropic layer 16C is counterclockwise (left-handed twist), with reference to the absorption axis of the polarizer 20, upon observation of the circularly polarizing plate 100C from the phase difference film 10C side.

In FIG. 11 and FIG. 12, the aspect in which the twisted direction of the liquid crystal compound is counterclockwise is described in detail, but an aspect in which the twisted direction of the liquid crystal compound is clockwise may be configured as long as the relationship of a predetermined angle is satisfied. More specifically, it may be an aspect in which the in-plane slow axis of the first optically anisotropic layer 12C is rotated counterclockwise by 15°, the twisted direction of the disk-like liquid crystal compound in the second optically anisotropic layer 14C is clockwise (right-handed twist), and the twisted direction of the rod-like liquid crystal compound in the third optically anisotropic layer 16C is clockwise (right-handed twist), with reference to the absorption axis of the polarizer 20, upon observation of the circularly polarizing plate 100C from the phase difference film 10C side.

That is, in the circularly polarizing plate including the third embodiment of the phase difference film, in a case where the in-plane slow axis of the first optically anisotropic layer is rotated clockwise by 15° with reference to the absorption axis of the polarizer, upon observation of the circularly polarizing plate from the phase difference film side, it is preferable that the twisted direction of the liquid crystal compound in the second optically anisotropic layer is counterclockwise with reference to the in-plane slow axis on the surface of the second optically anisotropic layer on the third optically anisotropic layer side, and the twisted direction of the liquid crystal compound in the third optically anisotropic layer is counterclockwise with reference to the in-plane slow axis on the surface of the third optically anisotropic layer opposite to the second optically anisotropic layer side.

In addition, in the circularly polarizing plate including the third embodiment of the phase difference film, in a case where the in-plane slow axis of the first optically anisotropic layer is rotated counterclockwise by 15° with reference to the absorption axis of the polarizer, upon observation of the circularly polarizing plate from the phase difference film side, it is preferable that the twisted direction of the liquid crystal compound in the second optically anisotropic layer is clockwise with reference to the in-plane slow axis on the surface of the second optically anisotropic layer on the third optically anisotropic layer side, and the twisted direction of the liquid crystal compound in the third optically anisotropic layer is clockwise with reference to the in-plane slow axis on the surface of the third optically anisotropic layer opposite to the second optically anisotropic layer side.

The circularly polarizing plate may have a member other than the phase difference film and the polarizer.

The circularly polarizing plate may have an adhesion layer between the phase difference film and the polarizer.

Examples of the adhesion layer include known pressure sensitive adhesive layers and adhesive layers.

The method for producing the above-described circularly polarizing plate is not particularly limited and may be, for example, a known method.

For example, there is a method of bonding a polarizer and a phase difference film through an adhesion layer.

Fourth Embodiment of Phase Difference Film

Figure 13:
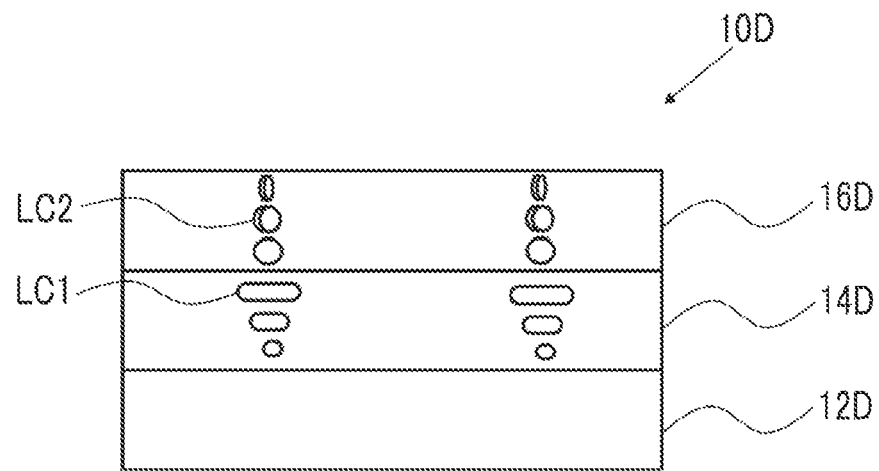
FIG. 13 is an example of a schematic cross-sectional view of a fourth embodiment of the phase difference film of the present invention.

Hereinafter, the fourth embodiment of the phase difference film according to the embodiment of the present invention will be described with reference to the accompanying drawings. FIG. 13 shows a schematic cross-sectional view of the fourth embodiment of the phase difference film according to the embodiment of the present invention.

A phase difference film 10D has a first optically anisotropic layer 12D, a second optically anisotropic layer 14D, and a third optically anisotropic layer 16D in this order.

The first optically anisotropic layer 12D is a negative A-plate, the second optically anisotropic layer 14D is a layer formed by fixing a rod-like liquid crystal compound LC1 twist-aligned along a helical axis extending in a thickness direction, and the third optically anisotropic layer 16D is a layer formed by fixing a disk-like liquid crystal compound LC2 twist-aligned along a helical axis extending in a thickness direction.

The in-plane slow axis of the first optically anisotropic layer 12D is parallel to the in-plane slow axis on the surface of the second optically anisotropic layer 14D on the first optically anisotropic layer 12D side.

The in-plane slow axis on the surface of the second optically anisotropic layer 14D on the third optically anisotropic layer 16D side is parallel to the in-plane slow axis on the surface of the third optically anisotropic layer 16D on the second optically anisotropic layer 14D side.

Hereinafter, each of those layers will be described in detail.

(First Optically Anisotropic Layer 12D)

The first optically anisotropic layer 12D is a negative A-plate.

The in-plane retardation of the first optically anisotropic layer 12D at a wavelength of 550 nm is not particularly limited, and is preferably 120 to 240 nm and more preferably 130 to 230 nm from the viewpoint that the effect of the present invention is more excellent.

The thickness direction retardation of the first optically anisotropic layer 12D at a wavelength of 550 nm is not particularly limited, and is preferably −120 to −60 nm and more preferably −115 to −65 nm from the viewpoint that the effect of the present invention is more excellent.

The first optically anisotropic layer 12D may exhibit forward wavelength dispersibility (a characteristic that the in-plane retardation decreases as the measurement wavelength increases) or reverse wavelength dispersibility (a characteristic that the in-plane retardation increases as the measurement wavelength increases). The forward wavelength dispersibility and the reverse wavelength dispersibility are preferably exhibited in a visible light range.

The configuration of the first optically anisotropic layer 12D is not particularly limited as long as it is a negative A-plate, and examples thereof include a layer formed by fixing a disk-like liquid crystal compound that is vertically aligned and whose optical axis (axis orthogonal to the disc plane) is arranged in the same direction and a stretching film, among which a layer formed by fixing a disk-like liquid crystal compound vertically aligned is preferable from the viewpoint that the effect of the present invention is more excellent.

The state in which a disk-like liquid crystal compound is vertically aligned means that the disc plane of the disk-like liquid crystal compound is parallel to the thickness direction of the layer. It is not required to be strictly parallel, but an angle formed by the disc plane and the thickness direction of the layer is preferably in a range of 0°±20° and more preferably in a range of 0°±10°.

In addition, the state in which optical axes (axes orthogonal to the disc plane) of the disk-like liquid crystal compound are arranged in the same orientation does not require that the optical axes of the disk-like liquid crystal compound are arranged strictly in the same orientation, but it is intended that, in a case where orientations of the slow axes are measured at any 20 positions in the plane, the maximum difference in slow axis orientation among the slow axis orientations at 20 positions (the difference between two slow axis orientations having the largest difference among the 20 slow axis orientations) is less than 10°.

The type of the disk-like liquid crystal compound used for forming the first optically anisotropic layer 12D is not particularly limited, and examples thereof include known compounds.

The disk-like liquid crystal compound may have a polymerizable group.

The types of polymerizable groups that the disk-like liquid crystal compound may have are as described above.

The first optically anisotropic layer 12D is preferably a layer formed by fixing a disk-like liquid crystal compound having a polymerizable group by means of polymerization.

The in-plane slow axis of the first optically anisotropic layer 12D is parallel to the in-plane slow axis on the surface of the second optically anisotropic layer 14D on the first optically anisotropic layer 12D side.

The thickness of the first optically anisotropic layer 12D is not particularly limited, and is preferably 10 µm or less, more preferably 0.1 to 5.0 µm, and still more preferably 0.3 to 2.0 µm.

The thickness of the first optically anisotropic layer 12D is intended to refer to an average thickness of the first optically anisotropic layer 12D. The average thickness is obtained by measuring the thicknesses of any five or more points of the first optically anisotropic layer 12D and arithmetically averaging the measured values.

(Second Optically Anisotropic Layer 14D)

The second optically anisotropic layer 14D is a layer formed by fixing a rod-like liquid crystal compound LC1 twist-aligned along a helical axis extending in a thickness direction.

The second optically anisotropic layer 14D is preferably a layer formed by fixing a so-called chiral nematic phase having a helical structure. In a case of forming the second optically anisotropic layer 14D, it is preferable to use at least a liquid crystal compound and a chiral agent.

The twisted angle of the rod-like liquid crystal compound (twisted angle of the liquid crystal compound in an alignment direction) is not particularly limited, and is often more than 0° and 360° or less. From the viewpoint that the effect of the present invention is more excellent, the twisted angle of the rod-like liquid crystal compound is preferably within a range of 80°±30° (within a range of 50° to 110°) and more preferably within a range of 80°±20° (within a range of 60° to 100°).

The twisted angle is measured using an AxoScan (polarimeter) device of Axometrics, Inc. and using device analysis software of Axometrics, Inc.

In addition, the expression "rod-like liquid crystal compound is twist-aligned" is intended to mean that the rod-like liquid crystal compound from one main surface to the other main surface of the second optically anisotropic layer 14D is twisted around the thickness direction of the second optically anisotropic layer 14D. Along with this, the alignment direction (in-plane slow axis direction) of the rod-like liquid crystal compound varies depending on the position in the thickness direction of the second optically anisotropic layer 14D.

In the twisted alignment, the major axis of the rod-like liquid crystal compound is arranged so as to be parallel to the main surface of the second optically anisotropic layer 14D. It is not required to be strictly parallel, and the angle formed by the major axis of the rod-like liquid crystal compound and the main surface of the second optically anisotropic layer 14D is preferably in a range of 0°±20° and more preferably in a range of 0°±10°.

A value of a product Δnd of a refractive index anisotropy Δn of the second optically anisotropic layer 14D at a wavelength of 550 nm and a thickness d of the second optically anisotropic layer 14D is not particularly limited, and is preferably 120 to 240 nm and more preferably 130 to 230 nm from the viewpoint that the effect of the present invention is more excellent.

The Δnd is measured using an AxoScan (polarimeter) device of Axometrics, Inc. and using device analysis software of Axometrics, Inc.

The in-plane slow axis on the surface of the first optically anisotropic layer 12D on the second optically anisotropic layer 14D side is parallel to the in-plane slow axis on the surface of the second optically anisotropic layer 14D on the first optically anisotropic layer 12D side.

The type of the rod-like liquid crystal compound used for forming the second optically anisotropic layer 14D is not particularly limited, and examples thereof include known compounds.

The rod-like liquid crystal compound may have a polymerizable group.

The types of polymerizable groups that the rod-like liquid crystal compound may have are as described above.

The second optically anisotropic layer 14D is preferably a layer formed by fixing a rod-like liquid crystal compound having a polymerizable group by means of polymerization. More specifically, the second optically anisotropic layer 14D is more preferably a layer formed by fixing a rod-like liquid crystal compound twist-aligned and having a polymerizable group by means of polymerization.

The thickness of the second optically anisotropic layer 14D is not particularly limited, and is preferably 10 μm or less, more preferably 0.1 to 5.0 μm, and still more preferably 0.3 to 2.0 μm.

The thickness of the second optically anisotropic layer 14D is intended to refer to an average thickness of the second optically anisotropic layer 14D. The average thickness is obtained by measuring the thicknesses of any five or more points of the second optically anisotropic layer 14D and arithmetically averaging the measured values.

(Third Optically Anisotropic Layer 16D)

The third optically anisotropic layer 16D is a layer formed by fixing a disk-like liquid crystal compound LC2 twist-aligned along a helical axis extending in a thickness direction.

In a case of forming the third optically anisotropic layer 16D, it is preferable to use at least a disk-like liquid crystal compound and a chiral agent.

The twisted angle of the disk-like liquid crystal compound (twisted angle of the disk-like liquid crystal compound in an alignment direction) is not particularly limited, and is often more than 0° and 360° or less. From the viewpoint that the effect of the present invention is more excellent, the twisted angle of the disk-like liquid crystal compound is preferably within a range of 175°±30° (within a range of 145° to 205°) and more preferably within a range of 175°±20° (within a range of 155° to 195°).

The twisted angle is measured using an AxoScan (polarimeter) device of Axometrics, Inc. and using device analysis software of Axometrics, Inc.

In addition, the expression "disk-like liquid crystal compound is twist-aligned" is intended to mean that the disk-like liquid crystal compound from one main surface to the other main surface of the third optically anisotropic layer 16D is twisted around the thickness direction of the third optically anisotropic layer 16D. Along with this, the alignment direction (in-plane slow axis direction) of the disk-like liquid crystal compound varies depending on the position in the thickness direction of the third optically anisotropic layer 16D.

In the twisted alignment, the disk-like liquid crystal compound is vertically aligned. The state in which the disk-like liquid crystal compound is vertically aligned means that the disc plane of the disk-like liquid crystal compound is parallel to the thickness direction of the third optically anisotropic layer 16D. It is not required to be strictly parallel, and the angle formed by the disc plane and the thickness direction of the third optically anisotropic layer 16D is preferably in a range of 0°±20° and preferably in a range of 0°±10°.

The in-plane slow axis on the surface of the second optically anisotropic layer 14D on the third optically anisotropic layer 16D side is parallel to the in-plane slow axis on the surface of the third optically anisotropic layer 16D on the second optically anisotropic layer 14D side. In the aspect shown in FIG. 13, the in-plane slow axis on the surface of the second optically anisotropic layer 14D on the third optically anisotropic layer 16D side is parallel to the in-plane slow axis on the surface of the third optically anisotropic layer 16D on the second optically anisotropic layer 14D side, but the present embodiment is not limited to the above aspect. The in-plane slow axis on the surface of the second optically anisotropic layer 14D on the third optically anisotropic layer 16D side may not be parallel to the in-plane slow axis on the surface of the third optically anisotropic layer 16D on the second optically anisotropic layer 14D side.

A value of a product Δnd of a refractive index anisotropy Δn of the third optically anisotropic layer 16D at a wavelength of 550 nm and a thickness d of the third optically anisotropic layer 16D is not particularly limited, and is preferably 70 to 190 nm and more preferably 80 to 180 nm from the viewpoint that the effect of the present invention is more excellent.

The Δnd is measured using an AxoScan (polarimeter) device of Axometrics, Inc. and using device analysis software of Axometrics, Inc.

The type of the disk-like liquid crystal compound used for forming the third optically anisotropic layer 16D is not particularly limited, and examples thereof include known compounds.

The disk-like liquid crystal compound may have a polymerizable group.

The types of polymerizable groups that the disk-like liquid crystal compound may have are as described above.

The third optically anisotropic layer 16D is preferably a layer formed by fixing a disk-like liquid crystal compound having a polymerizable group by means of polymerization. More specifically, the third optically anisotropic layer 16D is more preferably a layer formed by fixing a disk-like liquid crystal compound twist-aligned and having a polymerizable group by means of polymerization.

The thickness of the third optically anisotropic layer 16D is not particularly limited, and is preferably 10 μm or less, more preferably 0.1 to 5.0 μm, and still more preferably 0.3 to 2.0 μm.

The thickness of the third optically anisotropic layer 16D is intended to refer to an average thickness of the third optically anisotropic layer 16D. The average thickness is obtained by measuring the thicknesses of any five or more points of the third optically anisotropic layer 16D and arithmetically averaging the measured values.

(Other Members)

The phase difference film 10D may include members other than the above-mentioned first optically anisotropic layer 12D to third optically anisotropic layer 16D.

Examples of other members include the other members described in the above-mentioned first embodiment of the phase difference film.

The methods for producing the first optically anisotropic layer 12D to the third optically anisotropic layer 16D are not particularly limited, and the above-mentioned methods for producing the first optically anisotropic layer 12A to the fourth optically anisotropic layer 18A can be mentioned.

Fourth Embodiment of Circularly Polarizing Plate

The fourth embodiment of the phase difference film according to the embodiment of the present invention can be used as a circularly polarizing plate in combination with a polarizer.

The circularly polarizing plate according to the embodiment of the present invention having the above configuration is suitably used for antireflection applications of a display device such as a liquid crystal display device (LCD), a plasma display panel (PDP), an electroluminescent display (ELD), or a cathode tube display device (CRT).

The polarizer is as described in the first embodiment.

Figure 14:
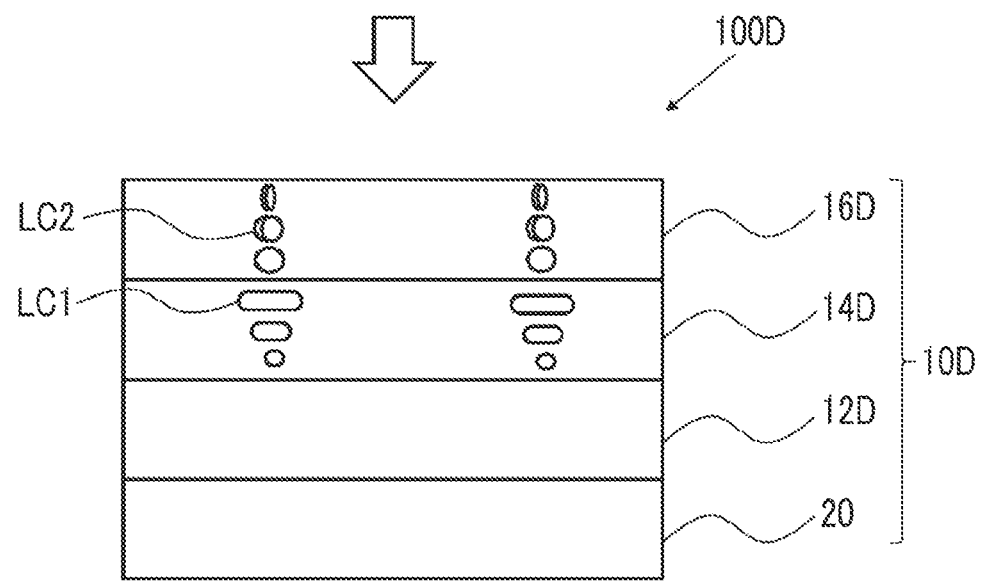
FIG. 14 is an example of a schematic cross-sectional view of a fourth embodiment of the circularly polarizing plate of the present invention.
Figure 15:
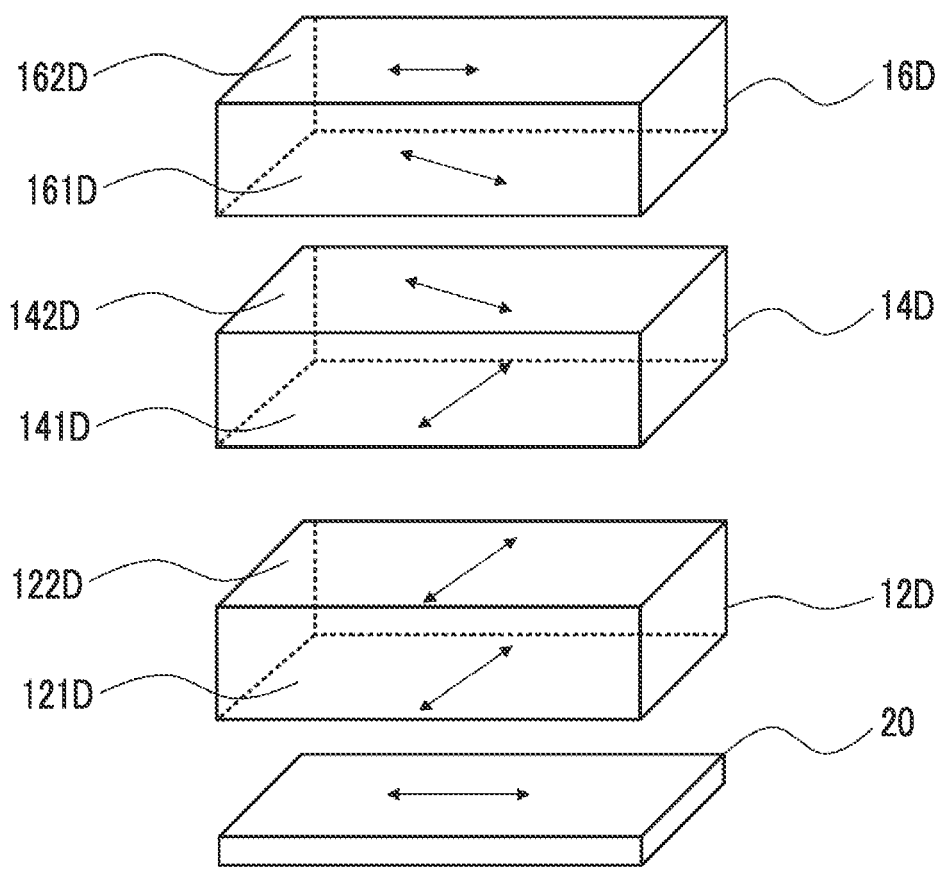
FIG. 15 is a view showing a relationship between an absorption axis of a polarizer and an in-plane slow axis of each of a first optically anisotropic layer to a third optically anisotropic layer in the fourth embodiment of the circularly polarizing plate of the present invention.

FIG. 14 shows a schematic cross-sectional view of an embodiment of a circularly polarizing plate 100D. In addition, FIG. 15 is a view showing a relationship between the absorption axis of the polarizer 20 and the in-plane slow axis of each of the first optically anisotropic layer 12D to the third optically anisotropic layer 16D in the circularly polarizing plate 100D shown in FIG. 14. In FIG. 15, the arrow in the polarizer 20 indicates an absorption axis, and the arrow in the first optically anisotropic layer 12D to the third optically anisotropic layer 16D indicates an in-plane slow axis in each layer.

Figure 16:
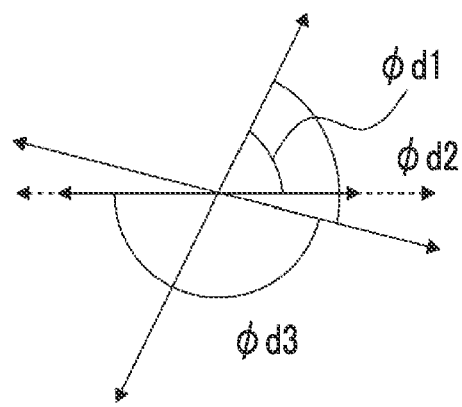
FIG. 16 is a schematic view showing a relationship of an angle between the absorption axis of the polarizer and the in-plane slow axis of each of the first optically anisotropic layer to the third optically anisotropic layer, upon observation from the direction of a white arrow in FIG. 14.

In addition, FIG. 16 is a view showing a relationship between the angle between the absorption axis (broken line) of the polarizer 20 and the in-plane slow axis (solid line) of each of the first optically anisotropic layer 12D to the third optically anisotropic layer 16D, upon observation from the white arrow in FIG. 14.

The rotation angle of the in-plane slow axis is represented by a positive angle value in a counterclockwise direction and a negative angle value in a clockwise direction, with reference to the absorption axis of the polarizer 20) (0°), upon observation from the white arrow in FIG. 14. In addition, whether the twisted direction is a right-handed twist (clockwise) or a left-handed twist (counterclockwise) is determined with reference to the in-plane slow axis on the surface of the front side (the side opposite to the polarizer 20 side) in the second optically anisotropic layer 14D and the third optically anisotropic layer 16D, upon observation from the white arrow in FIG. 14.

As shown in FIG. 14, the circularly polarizing plate 100D includes the polarizer 20, the first optically anisotropic layer 12D, the second optically anisotropic layer 14D, and the third optically anisotropic layer 16D in this order.

As shown in FIG. 15 and FIG. 16, an angle φd1 formed by the absorption axis of the polarizer 20 and the in-plane slow axis of the first optically anisotropic layer 12D is 75°. More specifically, the in-plane slow axis of the first optically anisotropic layer 12D is rotated by 75° (counterclockwise 75°) with respect to the absorption axis of the polarizer 20. Although FIG. 14 to FIG. 16 show an aspect in which the in-plane slow axis of the first optically anisotropic layer 12D is at a position of 75°, the present invention is not limited to this aspect. The in-plane slow axis of the first optically anisotropic layer 12D is preferably within a range of 75°±13°. That is, the angle formed by the absorption axis of the polarizer 20 and the in-plane slow axis of the first optically anisotropic layer 12D is preferably within a range of 75°±13°.

As shown in FIG. 15, in the first optically anisotropic layer 12D, the in-plane slow axis on a surface 121D of the first optically anisotropic layer 12D on the polarizer 20 side is parallel to the in-plane slow axis on a surface 122D of the first optically anisotropic layer 12D on the second optically anisotropic layer 14D side.

As shown in FIG. 15, the in-plane slow axis on the surface 122D of the first optically anisotropic layer 12D on the second optically anisotropic layer 14D side is parallel to the in-plane slow axis on a surface 141D of the second optically anisotropic layer 14D on the first optically anisotropic layer 12D side.

As described above, the second optically anisotropic layer 14D is a layer formed by fixing a rod-like liquid crystal compound twist-aligned along a helical axis extending in a thickness direction. Therefore, as shown in FIG. 15 and FIG. 16, the in-plane slow axis on the surface 141D of the second optically anisotropic layer 14D on the first optically anisotropic layer 12D side and the in-plane slow axis on a surface 142D of the second optically anisotropic layer 14D opposite to the first optically anisotropic layer 12D side form the above-mentioned twisted angle (80° in FIG. 15). That is, an angle φd2 formed by the in-plane slow axis on the surface 141D of the second optically anisotropic layer 14D on the first optically anisotropic layer 12D side and the in-plane slow axis on the surface 142D of the second optically anisotropic layer 14D opposite to the first optically anisotropic layer 12D side is 80°. More specifically, the twisted direction of the rod-like liquid crystal compound in the second optically anisotropic layer 14D is a left-handed twist (counterclockwise), and the twisted angle is 80°. Therefore, the angle formed by the absorption axis of the polarizer 20 and the in-plane slow axis on the surface 142D of the second optically anisotropic layer 14D opposite to the polarizer 20 side is 5°.

Although FIG. 15 and FIG. 16 show an aspect in which the twisted angle of the rod-like liquid crystal compound in the second optically anisotropic layer 14D is 80°, the present invention is not limited to this aspect. The twisted angle of the rod-like liquid crystal compound may be within a range of 80°±30°. That is, the angle formed by the in-plane slow axis on the surface 141D of the second optically anisotropic layer 14D on the first optically anisotropic layer 12D side and the in-plane slow axis on the surface 142D of the second optically anisotropic layer 14D opposite to the first optically anisotropic layer 12D side is preferably within a range of 80°±30°.

In addition, as shown in FIG. 15, the in-plane slow axis on the surface 142D of the second optically anisotropic layer 14D on the third optically anisotropic layer 16D side is parallel to the in-plane slow axis on a surface 161D of the third optically anisotropic layer 16D on the second optically anisotropic layer 14D side.

As described above, the third optically anisotropic layer 16D is a layer formed by fixing a disk-like liquid crystal compound twist-aligned along a helical axis extending in a thickness direction. Therefore, as shown in FIG. 15 and FIG. 16, the in-plane slow axis on the surface 161D of the third optically anisotropic layer 16D on the second optically anisotropic layer 14D side and the in-plane slow axis on a surface 162D of the third optically anisotropic layer 16D opposite to the second optically anisotropic layer 14D side form the above-mentioned twisted angle (175° in FIG. 15). That is, an angle φd3 formed by the in-plane slow axis on the surface 161D of the third optically anisotropic layer 16D on the second optically anisotropic layer 14D side and the in-plane slow axis on the surface 162D of the third optically anisotropic layer 16D opposite to the second optically anisotropic layer 14D side is 175°. More specifically, the twisted direction of the disk-like liquid crystal compound in the third optically anisotropic layer 16D is a left-handed twist (counterclockwise), and the twisted angle is 175°. Therefore, the angle formed by the absorption axis of the polarizer 20 and the in-plane slow axis on the surface 162D of the third optically anisotropic layer 16D opposite to the polarizer 20 side is 180°.

Although FIG. 15 and FIG. 16 show an aspect in which the twisted angle of the disk-like liquid crystal compound in the third optically anisotropic layer 16D is 175°, the present invention is not limited to this aspect. The twisted angle of the disk-like liquid crystal compound is preferably within a range of 175°±30°. That is, the angle formed by the in-plane slow axis on the surface 161D of the third optically anisotropic layer 16D on the second optically anisotropic layer 14D side and the in-plane slow axis on the surface 162D of the third optically anisotropic layer 16D opposite to the second optically anisotropic layer 14D side is preferably within a range of 175°±30°.

As described above, in the aspect of FIG. 15 and FIG. 16, the in-plane slow axis of the first optically anisotropic layer 12D is rotated counterclockwise by 75°, the twisted direction of the rod-like liquid crystal compound in the second optically anisotropic layer 14D is counterclockwise (left-handed twist), and the twisted direction of the disk-like liquid crystal compound in the third optically anisotropic layer 16D is counterclockwise (left-handed twist), with reference to the absorption axis of the polarizer 20, upon observation of the circularly polarizing plate 100D from the phase difference film 10D side.

In FIG. 15 and FIG. 16, the aspect in which the twisted direction of the liquid crystal compound is counterclockwise is described in detail, but an aspect in which the twisted direction of the liquid crystal compound is clockwise may be configured as long as the relationship of a predetermined angle is satisfied. More specifically, it may be an aspect in which the in-plane slow axis of the first optically anisotropic layer 12D is rotated clockwise by 75°, the twisted direction of the rod-like liquid crystal compound in the second optically anisotropic layer 14D is clockwise (right-handed twist), and the twisted direction of the disk-like liquid crystal compound in the third optically anisotropic layer 16D is clockwise (right-handed twist), with reference to the absorption axis of the polarizer 20, upon observation of the circularly polarizing plate 100D from the phase difference film 10D side.

That is, in the circularly polarizing plate including the fourth embodiment of the phase difference film, in a case where the in-plane slow axis of the first optically anisotropic layer is rotated counterclockwise within a range of 75°±13° (preferably 75°±10°) with reference to the absorption axis of the polarizer, upon observation of the circularly polarizing plate from the phase difference film side, it is preferable that the twisted direction of the liquid crystal compound in the second optically anisotropic layer is counterclockwise with reference to the in-plane slow axis on the surface of the second optically anisotropic layer on the third optically anisotropic layer side, and the twisted direction of the liquid crystal compound in the third optically anisotropic layer is counterclockwise with reference to the in-plane slow axis on the surface of the third optically anisotropic layer opposite to the second optically anisotropic layer side.

In addition, in the circularly polarizing plate including the fourth embodiment of the phase difference film, in a case where the in-plane slow axis of the first optically anisotropic layer is rotated clockwise within a range of 75°±13° (preferably 75°±10°) with reference to the absorption axis of the polarizer, upon observation of the circularly polarizing plate from the phase difference film side, it is preferable that the twisted direction of the liquid crystal compound in the second optically anisotropic layer is clockwise with reference to the in-plane slow axis on the surface of the second optically anisotropic layer on the third optically anisotropic layer side, and the twisted direction of the liquid crystal compound in the third optically anisotropic layer is clockwise with reference to the in-plane slow axis on the surface of the third optically anisotropic layer opposite to the second optically anisotropic layer side.

The circularly polarizing plate may have a member other than the phase difference film and the polarizer.

The circularly polarizing plate may have an adhesion layer between the phase difference film and the polarizer.

Examples of the adhesion layer include known pressure sensitive adhesive layers and adhesive layers.

The method for producing the above-described circularly polarizing plate is not particularly limited and may be, for example, a known method.

For example, there is a method of bonding a polarizer and a phase difference film through an adhesion layer.

Uses

The above-mentioned phase difference film can be applied to various applications and can be used, for example, as a so-called λ/4 plate or λ/2 plate by adjusting the optical properties of each optically anisotropic layer.

The λ/4 plate is a plate having a function of converting linearly polarized light having a specific wavelength into circularly polarized light (or converting circularly polarized light having a specific wavelength into linearly polarized light). More specifically, the λ/4 plate is a plate in which the in-plane retardation Re at a predetermined wavelength of λ nm is λ/4 (or an odd multiple of λ/4).

The in-plane retardation at a wavelength of 550 nm (Re(550)) of the λ/4 plate may have an error of about 25 nm around an ideal value (137.5 nm) and is, for example, preferably 110 to 160 nm and more preferably 120 to 150 nm.

In addition, the λ/2 plate refers to an optically anisotropic film in which the in-plane retardation Re(λ) at a specific wavelength of λ nm satisfies Re(λ)≈λ/2. This expression may be achieved at any wavelength (for example, 550 nm) in a visible light region. Above all, it is preferable that the in-plane retardation Re(550) at a wavelength of 550 nm satisfies the following relationship.

$$210 \text{ nm} \leq Re(550) \leq 300 \text{ nm}$$

Display Device

The phase difference films (first embodiment to fourth embodiment) and circularly polarizing plates (first embodiment to fourth embodiment) according to the embodiment of the present invention can be suitably applied to a display device.

The display device according to the embodiment of the present invention has an image display element and the above-mentioned phase difference film or circularly polarizing plate.

In a case where the phase difference film according to the embodiment of the present invention is applied to a display device, it is preferably applied as the above-mentioned circularly polarizing plate. In this case, the circularly polarizing plate is disposed on a viewing side, and a polarizer is disposed on the viewing side in the circularly polarizing plate.

The image display element is not particularly limited, and examples thereof include an organic electroluminescent display element and a liquid crystal display element.

EXAMPLES

Hereinafter, features of the present invention will be described in more detail with reference to examples and comparative examples. The materials, amounts used, proportions, treatment details, and treatment procedure shown in the following examples can be appropriately changed without departing from the spirit and scope of the present invention. Accordingly, the scope of the present invention should not be construed as being limited by the specific examples given below.

Example 1

(Preparation of Cellulose Acylate Film)

The following composition was put into a mixing tank, stirred, and further heated at 90° C. for 10 minutes. Then, the obtained composition was filtered through a filter paper having an average pore diameter of 34 μm and a sintered metal filter having an average pore diameter of 10 μm to prepare a dope. The concentration of solid contents of the dope is 23.5% by mass, and the solvent of the dope is methylene chloride/methanol/butanol=81/18/1 (mass ratio).

| Cellulose acylate dope | |
|---|---|
| Cellulose acylate (acetyl substitution degree: 2.86, viscosity average polymerization degree: 310) | 100 parts by mass |
| Sugar ester compound 1 (represented by Formula (S4)) | 6.0 parts by mass |
| Sugar ester compound 2 (represented by Formula (S5)) | 2.0 parts by mass |
| Silica particle dispersion (AEROSIL R972, manufactured by Nippon Aerosil Co., Ltd.) | 0.1 parts by mass |
| Solvent (methylene chloride/methanol/butanol) | |

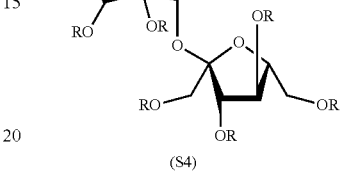

(S4)

(R = benzoyl or H
Average substitution degree: 5.7)

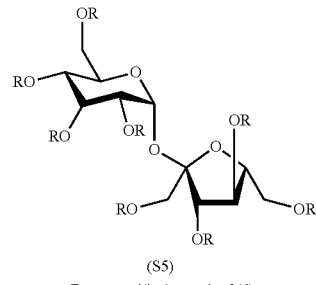

(S5)

(R = acetyl/isobutyryl = 2/6)

The dope prepared above was cast using a drum film forming machine. The dope was cast from a die in contact with a metal support cooled to 0° C., after which the resulting web (film) was stripped off. The drum was made of SUS.

The web (film) obtained by casting was peeled off from the drum. Then, at 30° C. to 40° C. at the time of transporting the film, using a tenter device that clips both ends of the web with clips and transports the web, the web was dried in the tenter device for 20 minutes. Subsequently, the web was post-dried by zone heating while being rolled and transported. The obtained web was knurled and then wound up.

The obtained cellulose acylate film had a film thickness of 40 μm, an in-plane retardation of 1 nm at a wavelength of 550 nm, and a thickness direction retardation of 26 nm at a wavelength of 550 nm.

(Formation of Alignment Film)

The photo-alignment film forming material described in Example 1 of WO2020/050305A was applied onto the elongated cellulose acylate film prepared above. Then, the coating film was cured by heating to 120° C. with hot air. Next, the coating film was irradiated with polarized ultraviolet rays having a wavelength of 365 nm to form a photo-alignment film.

(Formation of Optically Anisotropic Layer (1c))

A composition (1c) for forming an optically anisotropic layer containing a rod-like liquid crystal compound having the following composition was applied onto the photo-alignment film prepared above using a geeser coating machine, and heated with hot air at 80° C. for 60 seconds. Subsequently, the obtained composition layer was irradiated with UV (500 mJ/cm$^2$) at 80° C. to immobilize the alignment of the liquid crystal compound to form an optically anisotropic layer (1c) corresponding to the optically anisotropic layer Z.

The optically anisotropic layer (1c) had a thickness of 0.9 μm, a Δnd of 125 nm at a wavelength of 550 nm, and a twisted angle of liquid crystal compound of 175°. Assuming that the width direction of the film is defined as 0° (the longitudinal direction of the film is defined as 90°), the in-plane slow axis direction (the alignment axis angle of the liquid crystal compound) was 185° on the air side and 0° on the side in contact with the cellulose acylate film, in a case of being viewed from the optically anisotropic layer (1c) side.

The in-plane slow axis direction of the optically anisotropic layer is expressed as negative in a case where it is clockwise (right-handed turning) and positive in a case where it is counterclockwise (left-handed turning) with the width direction of the cellulose acylate film, which is a substrate, as a reference of 0°, upon observation of the substrate from the surface side of the optically anisotropic layer.

Fluorine-containing compound C (The numerical value in each repeating unit represents the content (% by mass) with respect to all the repeating units, the content of the repeating unit on the left side was 25% by mass, the content of the repeating unit in the middle was 25% by mass, and the content of the repeating unit on the right side was 50% by mass)

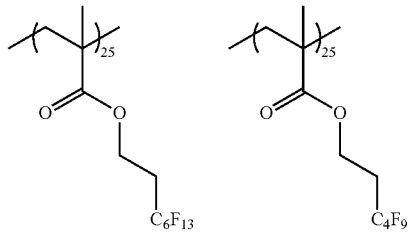

| Composition (1c) for forming optically anisotropic layer | |
|---|---|
| Rod-like liquid crystal compound (A) given below | 100 parts by mass |
| Ethylene oxide-modified trimethylolpropane triacrylate (V#360, manufactured by Osaka Organic Chemical Industry Ltd.) | 4 parts by mass |
| Photopolymerization initiator (IRGACURE 819, manufactured by BASF SE) | 3 parts by mass |
| Left-handed twisting chiral agent (L1) given below | 1.68 parts by mass |
| Fluorine-containing compound C given below | 0.08 parts by mass |
| Polymer (A) given below | 0.50 parts by mass |
| Methyl ethyl ketone | 156 parts by mass |

Rod-like liquid crystal compound (A) (hereinafter, a mixture of compounds)

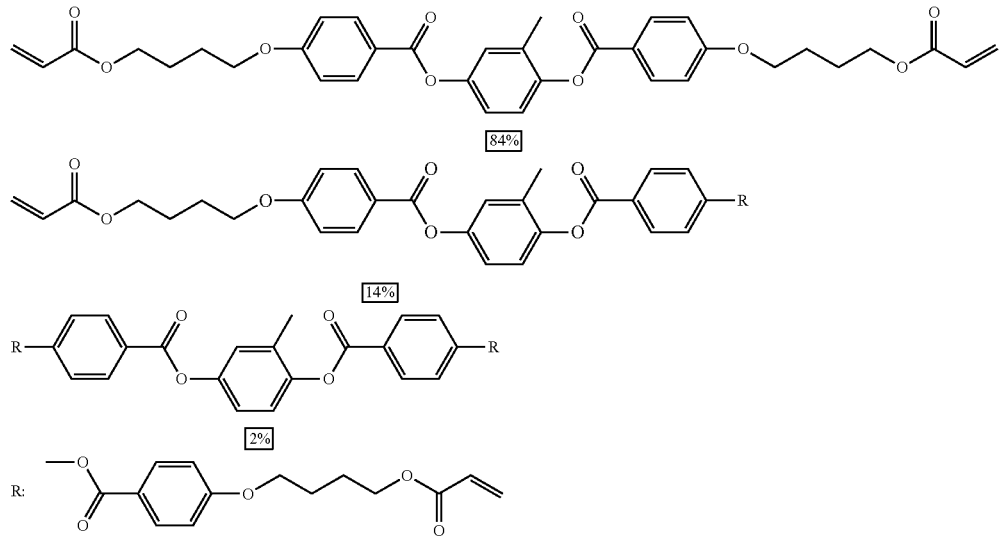

Left-handed twisting chiral agent (L1)

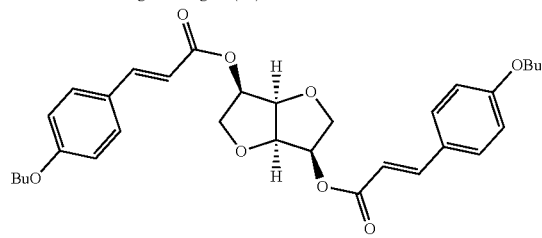

-continued

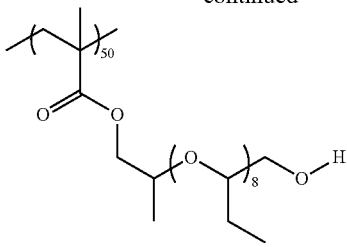

Polymer (A) (In the formulae, the numerical value described in each repeating unit represents the content (% by mass) of each repeating unit with respect to all the repeating units).

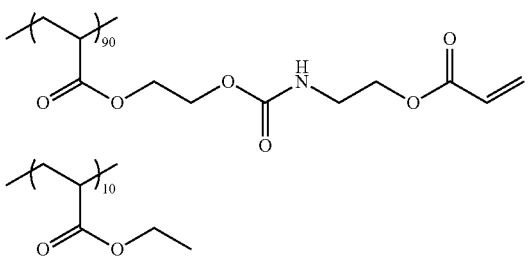

(Formation of Optically Anisotropic Layer (1b))

The surface of the optically anisotropic layer (1c) prepared above was continuously subjected to a rubbing treatment. At this time, the longitudinal direction and the transport direction of the elongated film were parallel, and the angle formed by the longitudinal direction (transport direction) of the film and the rotation axis of the rubbing roller was 85°. In a case where the longitudinal direction (transport direction) of the film is defined as 90° and the clockwise direction is represented by a positive value with the width direction of the film as a reference (0°) upon observation from the film side, the rotation axis of the rubbing roller is at −5°. In other words, the position of the rotation axis of the rubbing roller is a position rotated counterclockwise by 95° with reference to the longitudinal direction of the film.

A composition (1b) for forming an optically anisotropic layer containing a disk-like liquid crystal compound having the following composition was applied onto the optically anisotropic layer (1c) subjected to a rubbing treatment using a geeser coating machine to form a composition layer. Then, the obtained composition layer was heated with hot air at 110° C. for 2 minutes for drying of the solvent and alignment aging of the disk-like liquid crystal compound. Subsequently, the obtained composition layer was irradiated with UV (500 mJ/cm$^2$) at 80° C. to immobilize the alignment of the liquid crystal compound to form an optically anisotropic layer (1b) corresponding to the optically anisotropic layer Y.

The optically anisotropic layer (1b) had a thickness of 1.1 μm, a Δnd of 164 nm at a wavelength of 550 nm, and a twisted angle of liquid crystal compound of 81°. Assuming that the width direction of the film is defined as 0° (the longitudinal direction of the film is defined as 90°), the in-plane slow axis direction was 104° on the air side and 185° on the side in contact with the optically anisotropic layer (1c), in a case of being viewed from the optically anisotropic layer (1b) side.

The in-plane slow axis direction of the optically anisotropic layer is expressed as negative in a case where it is clockwise (right-handed turning) and positive in a case where it is counterclockwise (left-handed turning) with the width direction of the substrate as a reference of 0°, upon observation of the substrate from the surface side of the optically anisotropic layer.

| Composition (1b) for forming optically anisotropic layer | |
|---|---|
| Disk-like liquid crystal compound 1 given below | 80 parts by mass |
| Disk-like liquid crystal compound 2 given below | 20 parts by mass |
| Alignment film interface alignment agent 1 given below | 0.55 parts by mass |
| Fluorine-containing compound A given below | 0.1 parts by mass |
| Fluorine-containing compound B given below | 0.05 parts by mass |
| Fluorine-containing compound C given above | 0.21 parts by mass |
| Left-handed twisting chiral agent (L2) given below | 0.30 parts by mass |
| Ethylene oxide-modified trimethylolpropane triacrylate (V#360, manufactured by Osaka Organic Chemical Industry Ltd.) | 10 parts by mass |
| Photopolymerization initiator (IRGACURE 907, manufactured by BASF SE) | 3.0 parts by mass |
| Methyl ethyl ketone | 200 parts by mass |

Disk-like liquid crystal compound 1

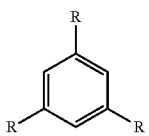

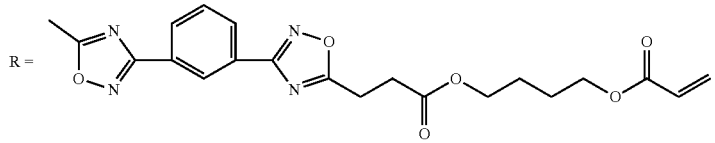 [SMILES: C=CC(=O)OCCCCOC(=O)CCc1nc(-c2cccc(-c3noc(C)n3)c2)no1]

-continued

Composition (1b) for forming optically anisotropic layer

Disk-like liquid crystal compound 2

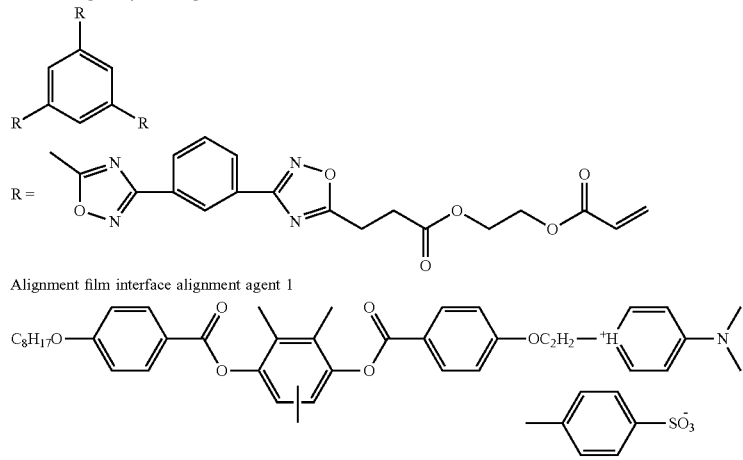

Alignment film interface alignment agent 1

Fluorine-containing compound A (in the following formula, a and b represent the content (% by mass) of each repeating unit with respect to all the repeating units, a represents 90% by mass, and b represents 10% by mass)

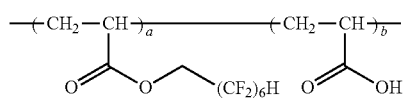

Fluorine-containing compound B (The numerical value in each repeating unit represents the content (% by mass) with respect to all the repeating units, the content of the repeating unit on the left side was 32.5% by mass, and the content of the repeating unit on the right side was 67.5% by mass.)

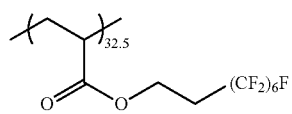

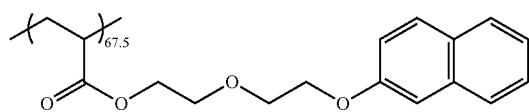

Left-handed twisting chiral agent (L2)

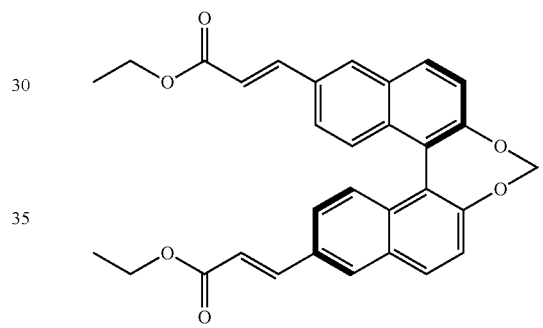

A laminate (1b-1c) in which the optically anisotropic layer (1c) and the optically anisotropic layer (1b) were laminated on the cellulose acylate film was prepared by the above procedure.

(Formation of Optically Anisotropic Layer (1a))

Next, a composition (1a) for forming an optically anisotropic layer containing a rod-like liquid crystal compound having the following composition was applied onto the optically anisotropic layer (1b) of the laminate (1b-1c) prepared above using a geeser coating machine, and heated with hot air at 80° C. for 60 seconds. Subsequently, the obtained composition layer was irradiated with UV (500 mJ/cm$^2$) at 80° C. to immobilize the alignment of the liquid crystal compound to form an optically anisotropic layer (1a) corresponding to the optically anisotropic layer X.

The thickness of the optically anisotropic layer (1a) was 1.2 μm. In addition, the in-plane retardation at a wavelength of 550 nm was 168 nm. It was confirmed that the average tilt angle of the major axis direction of the rod-like liquid crystal compound with respect to the film surface was 0° and the rod-like liquid crystal compound was aligned horizontally with respect to the film surface. In addition, assuming that the width direction of the film is defined as 0° (the longitudinal direction of the film is defined as 90° for counter-clockwise and −90° for clockwise), the in-plane slow axis direction was 104° in a case of being viewed from the optically anisotropic layer (1a) side.

| Composition (1a) for forming optically anisotropic layer | |
| --- | --- |
| Rod-like liquid crystal compound (A) given above | 100 parts by mass |
| Ethylene oxide-modified trimethylolpropane triacrylate (V#360, manufactured by Osaka Organic Chemical Industry Ltd.) | 4 parts by mass |
| Photopolymerization initiator (IRGACURE 819, manufactured by BASF SE) | 3 parts by mass |
| Fluorine-containing compound C given above | 0.08 parts by mass |
| Methyl ethyl ketone | 156 parts by mass |

A laminate (1a-1b-1c) in which the optically anisotropic layer (1c), the optically anisotropic layer (1b), and the optically anisotropic layer (1a) were laminated on the elongated cellulose acylate film was prepared by the above procedure.

Example 2

(Formation of Optically Anisotropic Layer (2c))

A photo-alignment film was formed on an elongated cellulose acylate film in the same manner as in Example 1.

A composition (2c) for forming an optically anisotropic layer containing a disk-like liquid crystal compound having the following composition was applied onto the photo-alignment film prepared above using a geeser coating machine to form a composition layer. Then, the obtained composition layer was heated with hot air at 110° C. for 2 minutes for drying of the solvent and alignment aging of the disk-like liquid crystal compound. Subsequently, the obtained composition layer was irradiated with UV (500 mJ/cm$^2$) at 80° C. to immobilize the alignment of the liquid crystal compound to form an optically anisotropic layer (2c) corresponding to the optically anisotropic layer Z.

The optically anisotropic layer (2c) had a thickness of 0.8 μm, a Δnd of 135 nm at a wavelength of 550 nm, and a twisted angle of liquid crystal compound of 175°. Assuming that the width direction of the film is defined as 0° (the longitudinal direction of the film is defined as 90°), the in-plane slow axis direction was 95° on the air side and 270° on the side in contact with the cellulose acylate film, in a case of being viewed from the optically anisotropic layer (2c) side.

The in-plane slow axis direction of the optically anisotropic layer is expressed as negative in a case where it is clockwise (right-handed turning) and positive in a case where it is counterclockwise (left-handed turning) with the width direction of the substrate as a reference of 0°, upon observation of the substrate from the surface side of the optically anisotropic layer.

| Composition (2c) for forming optically anisotropic layer | |
| --- | --- |
| Disk-like liquid crystal compound 1 given above | 80 parts by mass |
| Disk-like liquid crystal compound 2 given above | 20 parts by mass |
| Alignment film interface alignment agent 1 given above | 0.55 parts by mass |
| Fluorine-containing compound A given above | 0.1 parts by mass |
| Fluorine-containing compound B given above | 0.05 parts by mass |
| Fluorine-containing compound C given above | 0.21 parts by mass |

-continued

| Composition (2c) for forming optically anisotropic layer | |
| --- | --- |
| Left-handed twisting chiral agent (L2) given above | 0.78 parts by mass |
| Ethylene oxide-modified trimethylolpropane triacrylate (V#360, manufactured by Osaka Organic Chemical Industry Ltd.) | 10 parts by mass |
| Photopolymerization initiator (IRGACURE 907, manufactured by BASF SE) | 3.0 parts by mass |
| Methyl ethyl ketone | 200 parts by mass |

(Formation of Optically Anisotropic Layer (2b))

A composition (2b) for forming an optically anisotropic layer containing a rod-like liquid crystal compound having the following composition was applied onto the optically anisotropic layer (2c) prepared above using a geeser coating machine, and heated with hot air at 80° C. for 60 seconds. Subsequently, the obtained composition layer was irradiated with UV (500 mJ/cm$^2$) at 80° C. to immobilize the alignment of the liquid crystal compound to form an optically anisotropic layer (2b) corresponding to the optically anisotropic layer Y.

The optically anisotropic layer (2b) had a thickness of 1.2 μm, a Δnd of 164 nm at a wavelength of 550 nm, and a twisted angle of liquid crystal compound of 81°. Assuming that the width direction of the film is defined as 0° (the longitudinal direction of the film is defined as 90°), the in-plane slow axis direction was 14° on the air side and 95° on the side in contact with the optically anisotropic layer (2c) in a case of being viewed from the optically anisotropic layer (2b) side.

The in-plane slow axis direction of the optically anisotropic layer is expressed as negative in a case where it is clockwise (right-handed turning) and positive in a case where it is counterclockwise (left-handed turning) with the width direction of the substrate as a reference of 0°, upon observation of the substrate from the surface side of the optically anisotropic layer.

| Composition (2b) for forming optically anisotropic layer | |
| --- | --- |
| Rod-like liquid crystal compound (A) given above | 100 parts by mass |
| Ethylene oxide-modified trimethylolpropane triacrylate (V#360, manufactured by Osaka Organic Chemical Industry Ltd.) | 4 parts by mass |
| Photopolymerization initiator (IRGACURE 819, manufactured by BASF SE) | 3 parts by mass |
| Left-handed twisting chiral agent (L1) given above | 0.60 parts by mass |
| Fluorine-containing compound C given above | 0.08 parts by mass |
| Polymer (A) given above | 0.50 parts by mass |
| Methyl ethyl ketone | 156 parts by mass |

A laminate (2b-2c) in which the optically anisotropic layer (2c) and the optically anisotropic layer (2b) were laminated on the cellulose acylate film was prepared by the above procedure.

(Formation of Optically Anisotropic Layer (2a))

The optically anisotropic layer (2b) of the laminate (2b-2c) prepared above was continuously subjected to a rubbing treatment. At this time, the longitudinal direction and the transport direction of the elongated film were parallel, and the angle formed by the longitudinal direction (transport direction) of the film and the rotation axis of the rubbing roller was 76°. In a case where the longitudinal direction (transport direction) of the film is defined as 90° and the clockwise direction is represented by a positive value with the width direction of the film as a reference (0°) upon observation from the film side, the rotation axis of the rubbing roller is 14°. That is, the position of the rotation axis of the rubbing roller is a position rotated counterclockwise by 76° with the longitudinal direction of the film as a reference.

A composition (2a) for forming an optically anisotropic layer containing a disk-like liquid crystal compound having the following composition was applied onto the optically anisotropic layer (2b) subjected to a rubbing treatment using a geeser coating machine to form a composition layer. Then, the obtained composition layer was heated with hot air at 110° C. for 2 minutes for drying of the solvent and alignment aging of the disk-like liquid crystal compound. Subsequently, the obtained composition layer was irradiated with UV (500 mJ/cm$^2$) at 80° C. to immobilize the alignment of the liquid crystal compound to form an optically anisotropic layer (2a) corresponding to the optically anisotropic layer X.

The thickness of the optically anisotropic layer (2a) was 1.1 μm. In addition, the in-plane retardation at a wavelength of 550 nm was 168 nm. It was confirmed that the average tilt angle of the disc plane of the disk-like liquid crystal compound with respect to the film surface was 90°, and the disk-like liquid crystal compound was aligned vertically to the film surface. In addition, the angle of the slow axis of the optically anisotropic layer (2a) was parallel to the rotation axis of the rubbing roller, and assuming that the width direction of the film is defined as 0° (the longitudinal direction of the film is defined as 90° for counterclockwise and −90° for clockwise), the in-plane slow axis direction was 14° in a case of viewing from the optically anisotropic layer (2a) side.

| Composition (2a) for forming optically anisotropic layer | |
|---|---|
| Disk-like liquid crystal compound 1 given above | 80 parts by mass |
| Disk-like liquid crystal compound 2 given above | 20 parts by mass |
| Alignment film interface alignment agent 1 given above | 0.55 parts by mass |
| Fluorine-containing compound A given above | 0.1 parts by mass |
| Fluorine-containing compound B given above | 0.05 parts by mass |
| Fluorine-containing compound C given above | 0.21 parts by mass |
| Ethylene oxide-modified trimethylolpropane triacrylate (V#360, manufactured by Osaka Organic Chemical Industry Ltd.) | 10 parts by mass |
| Photopolymerization initiator (IRGACURE 907, manufactured by BASF SE) | 3.0 parts by mass |
| Methyl ethyl ketone | 200 parts by mass |

A laminate (2a-2b-2c) in which the optically anisotropic layer (2c), the optically anisotropic layer (2b), and the optically anisotropic layer (2a) were laminated on the elongated cellulose acylate film was prepared by the above procedure.

Example 3

(Formation of Optically Anisotropic Layer (3c))

A photo-alignment film was formed on an elongated cellulose acylate film in the same manner as in Example 1.

Onto the photo-alignment film prepared above, the composition (1b) for forming an optically anisotropic layer containing a disk-like liquid crystal compound of Example 1 was applied with different thickness using a geeser coating machine to form a composition layer. Then, the obtained composition layer was heated with hot air at 110° C. for 2 minutes for drying of the solvent and alignment aging of the disk-like liquid crystal compound. Subsequently, the obtained composition layer was irradiated with UV (500 mJ/cm$^2$) at 80° C. to immobilize the alignment of the liquid crystal compound to form an optically anisotropic layer (3c) corresponding to the optically anisotropic layer Z.

The optically anisotropic layer (3c) had a thickness of 0.6 μm, a Δnd of 82 nm at a wavelength of 550 nm, and a twisted angle of liquid crystal compound of 40.5°. Assuming that the width direction of the film is defined as 0° (the longitudinal direction of the film is defined as 90°), the in-plane slow axis direction was 54.5° on the air side and 95° on the side in contact with the cellulose acylate film, in a case of being viewed from the optically anisotropic layer (3c) side.

The in-plane slow axis direction of the optically anisotropic layer is expressed as negative in a case where it is clockwise (right-handed turning) and positive in a case where it is counterclockwise (left-handed turning) with the width direction of the substrate as a reference of 0°, upon observation of the substrate from the surface side of the optically anisotropic layer.

(Formation of Optically Anisotropic Layer (3b))

Onto the optically anisotropic layer (3c) prepared above, the composition (2b) for forming an optically anisotropic layer containing a rod-like liquid crystal compound of Example 2 was applied with different thickness using a geeser coating machine, and heated with hot air at 80° C. for 60 seconds. Subsequently, the obtained composition layer was irradiated with UV (500 mJ/cm$^2$) at 80° C. to immobilize the alignment of the liquid crystal compound to form an optically anisotropic layer (3b) corresponding to the optically anisotropic layer Y.

The optically anisotropic layer (3b) had a thickness of 0.6 μm, a Δnd of 82 nm at a wavelength of 550 nm, and a twisted angle of liquid crystal compound of 40.5°. Assuming that the width direction of the film is defined as 0° (the longitudinal direction of the film is defined as 90°), the in-plane slow axis direction was 14° on the air side and 54.5° on the side in contact with the optically anisotropic layer (3c) in a case of being viewed from the optically anisotropic layer (3b) side.

The in-plane slow axis direction of the optically anisotropic layer is expressed as negative in a case where it is clockwise (right-handed turning) and positive in a case where it is counterclockwise (left-handed turning) with the width direction of the substrate as a reference of 0°, upon observation of the substrate from the surface side of the optically anisotropic layer.

A laminate (3b-3c) in which the optically anisotropic layer (3c) and the optically anisotropic layer (3b) were laminated on the cellulose acylate film was prepared by the above procedure.

(Formation of Optically Anisotropic Layer (3a-3a'))

The optically anisotropic layer (3b) of the laminate (3b-3c) prepared above was continuously subjected to a rubbing treatment. At this time, the longitudinal direction and the transport direction of the elongated film were parallel, and the angle formed by the longitudinal direction (transport direction) of the film and the rotation axis of the rubbing roller was 76°. In a case where the longitudinal direction (transport direction) of the film is defined as 90° and the clockwise direction is represented by a positive value with the width direction of the film as a reference (0°) upon observation from the film side, the rotation axis of the rubbing roller is 14°. That is, the position of the rotation axis of the rubbing roller is a position rotated counterclockwise by 76° with the longitudinal direction of the film as a reference.

The composition (2a) for forming an optically anisotropic layer containing a disk-like liquid crystal compound of Example 2 was applied with different thickness onto the optically anisotropic layer (3b) subjected to a rubbing treatment using a geeser coating machine to form a composition layer. Then, the obtained composition layer was heated with hot air at 110° C. for 2 minutes for drying of the solvent and alignment aging of the disk-like liquid crystal compound. Subsequently, the obtained composition layer was irradiated with UV (500 mJ/cm$^2$) at 80° C. to immobilize the alignment of the liquid crystal compound to form an optically anisotropic layer (3a) corresponding to a part of the optically anisotropic layer X.

The thickness of the optically anisotropic layer (3a) was 0.8 µm. In addition, the in-plane retardation at a wavelength of 550 nm was 128 nm. It was confirmed that the average tilt angle of the disc plane of the disk-like liquid crystal compound with respect to the film surface was 90°, and the disk-like liquid crystal compound was aligned vertically to the film surface. In addition, the angle of the slow axis of the optically anisotropic layer (3a) was parallel to the rotation axis of the rubbing roller, and assuming that the width direction of the film is defined as 0° (the longitudinal direction of the film is defined as 90° for counterclockwise and −90° for clockwise), the in-plane slow axis direction was 14° in a case of being viewed from the optically anisotropic layer (3a) side.

A laminate (3a-3b-3c) in which the optically anisotropic layer (3c), the optically anisotropic layer (3b), and the optically anisotropic layer (3a) were laminated on the cellulose acylate film was prepared by the above procedure.

Onto the optically anisotropic layer (3a) of the laminate (3a-3b-3c) prepared above, the composition (1a) for forming an optically anisotropic layer containing a rod-like liquid crystal compound of Example 1 was applied with different thickness using a geeser coating machine, and heated with hot air at 80° C. for 60 seconds. Subsequently, the obtained composition layer was irradiated with UV (500 mJ/cm$^2$) at 80° C. to immobilize the alignment of the liquid crystal compound to form an optically anisotropic layer (3a') corresponding to a part of an optically anisotropic layer X.

The thickness of the optically anisotropic layer (3a') was 0.3 µm. In addition, the in-plane retardation at a wavelength of 550 nm was 40 nm. It was confirmed that the average tilt angle of the major axis direction of the rod-like liquid crystal compound with respect to the film surface was 0° and the rod-like liquid crystal compound was aligned horizontally with respect to the film surface. In addition, assuming that the width direction of the film is defined as 0° (the longitudinal direction of the film is defined as 90° for counterclockwise and −90° for clockwise), the in-plane slow axis direction was 14° in a case of being viewed from the optically anisotropic layer (3a') side.

A laminate (3a'-3a-3b-3c) in which the optically anisotropic layer (3c), the optically anisotropic layer (3b), the optically anisotropic layer (3a), and the optically anisotropic layer (3a') were laminated on the elongated cellulose acylate film was prepared by the above procedure.

Example 4

(Formation of Optically Anisotropic Layer (4c))

A photo-alignment film was formed on an elongated cellulose acylate film in the same manner as in Example 1.

Onto the photo-alignment film prepared above, the composition (2b) for forming an optically anisotropic layer containing a rod-like liquid crystal compound of Example 2 was applied with different thickness using a geeser coating machine, and heated with hot air at 80° C. for 60 seconds. Subsequently, the obtained composition layer was irradiated with UV (500 mJ/cm$^2$) at 80° C. to immobilize the alignment of the liquid crystal compound to form an optically anisotropic layer (4c) corresponding to the optically anisotropic layer Z.

The optically anisotropic layer (4c) had a thickness of 0.6 µm, a Δnd of 82 nm at a wavelength of 550 nm, and a twisted angle of liquid crystal compound of 40.5°. Assuming that the width direction of the film is defined as 0° (the longitudinal direction of the film is defined as 90°), the in-plane slow axis direction was 144.5° on the air side and 185° on the side in contact with the cellulose acylate film, in a case of being viewed from the optically anisotropic layer (4c) side.

The in-plane slow axis direction of the optically anisotropic layer is expressed as negative in a case where it is clockwise (right-handed turning) and positive in a case where it is counterclockwise (left-handed turning) with the width direction of the substrate as a reference of 0°, upon observation of the substrate from the surface side of the optically anisotropic layer.

(Formation of Optically Anisotropic Layer (4b))

The optically anisotropic layer (4c) prepared above was continuously subjected to a rubbing treatment. At this time, the longitudinal direction and the transport direction of the elongated film were parallel, and the angle formed by the longitudinal direction (transport direction) of the film and the rotation axis of the rubbing roller was 54.5°. In a case where the longitudinal direction (transport direction) of the film is 90° and the clockwise direction is represented by a positive value with the width direction of the film as a reference (0°) upon observation from the film side, the rotation axis of the rubbing roller is at 144.5°. In other words, the position of the rotation axis of the rubbing roller is a position rotated counterclockwise by 54.5° with reference to the longitudinal direction of the film.

The composition (1b) for forming an optically anisotropic layer containing a disk-like liquid crystal compound of Example 1 was applied with different thickness onto the optically anisotropic layer (4c) subjected to a rubbing treatment using a geeser coating machine to form a composition layer. Then, the obtained composition layer was heated with hot air at 110° C. for 2 minutes for drying of the solvent and alignment aging of the disk-like liquid crystal compound. Subsequently, the obtained composition layer was irradiated with UV (500 mJ/cm$^2$) at 80° C. to immobilize the alignment of the liquid crystal compound to form an optically anisotropic layer (4b) corresponding to the optically anisotropic layer Y.

The optically anisotropic layer (4b) had a thickness of 0.6 µm, a Δnd of 82 nm at a wavelength of 550 nm, and a twisted angle of liquid crystal compound of 40.5°. Assuming that the width direction of the film is defined as 0° (the longitudinal direction of the film is defined as 90°), the in-plane slow axis direction was 104° on the air side and 144.5° on the side in contact with the optically anisotropic layer (4c) in a case of being viewed from the optically anisotropic layer (4b) side.

The in-plane slow axis direction of the optically anisotropic layer is expressed as negative in a case where it is clockwise (right-handed turning) and positive in a case where it is counterclockwise (left-handed turning) with the width direction of the substrate as a reference of 0°, upon observation of the substrate from the surface side of the optically anisotropic layer.

A laminate (4b-4c) in which the optically anisotropic layer (4c) and the optically anisotropic layer (4b) were laminated on the cellulose acylate film was prepared by the above procedure.

(Formation of Optically Anisotropic Layer (4a-4a'))

A composition (4a) for forming an optically anisotropic layer containing a rod-like liquid crystal compound having the following composition was applied onto the optically anisotropic layer (4b) of the laminate (4b-4c) prepared above, and was heated with hot air at 80° C. for 60 seconds. Subsequently, the obtained composition layer was irradiated with UV (500 mJ/cm$^2$) at 80° C. to immobilize the alignment of the liquid crystal compound to form an optically anisotropic layer (4a) corresponding to a part of the optically anisotropic layer X.

The thickness of the optically anisotropic layer (4a) was 0.9 μm. In addition, the in-plane retardation at a wavelength of 550 nm was 128 nm. It was confirmed that the average tilt angle of the major axis direction of the rod-like liquid crystal compound with respect to the film surface was 0° and the rod-like liquid crystal compound was aligned horizontally with respect to the film surface. In addition, assuming that the width direction of the film is defined as 0° (the longitudinal direction of the film is defined as 90° for counterclockwise and −90° for clockwise), the slow axis was 104° in a case of being viewed from the optically anisotropic layer (4a) side.

| Composition (4a) for forming optically anisotropic layer | |
|---|---|
| Rod-like liquid crystal compound (A) given above | 100 parts by mass |
| Ethylene oxide-modified trimethylolpropane triacrylate (V#360, manufactured by Osaka Organic Chemical Industry Ltd.) | 4 parts by mass |
| Photopolymerization initiator (IRGACURE 819, manufactured by BASF SE) | 3 parts by mass |
| Fluorine-containing compound C given above | 0.08 parts by mass |
| Polymer (A) given above | 0.50 parts by mass |
| Methyl ethyl ketone | 156 parts by mass |

A laminate (4a-4b-4c) in which the optically anisotropic layer (4c), the optically anisotropic layer (4b), and the optically anisotropic layer (4a) were laminated on the cellulose acylate film was prepared by the above procedure.

The optically anisotropic layer (4a) of the laminate (4a-4b-4c) prepared above was continuously subjected to a rubbing treatment. At this time, the longitudinal direction and the transport direction of the elongated film were parallel, and the angle formed by the longitudinal direction (transport direction) of the film and the rotation axis of the rubbing roller was 76°. In a case where the longitudinal direction (transport direction) of the film is defined as 90° and the clockwise direction is represented by a positive value with the width direction of the film as a reference (0°) upon observation from the film side, the rotation axis of the rubbing roller is 14°. That is, the position of the rotation axis of the rubbing roller is a position rotated counterclockwise by 76° with the longitudinal direction of the film as a reference.

The composition (2a) for forming an optically anisotropic layer containing a disk-like liquid crystal compound of Example 2 was applied with different thickness onto the optically anisotropic layer (4a) subjected to a rubbing treatment using a geeser coating machine to form a composition layer. Then, the obtained composition layer was heated with hot air at 110° C. for 2 minutes for drying of the solvent and alignment aging of the disk-like liquid crystal compound. Subsequently, the obtained composition layer was irradiated with UV (500 mJ/cm$^2$) at 80° C. to immobilize the alignment of the liquid crystal compound to form an optically anisotropic layer (4a') corresponding to a part of the optically anisotropic layer X.

The thickness of the optically anisotropic layer (4a') was 0.3 μm. In addition, the in-plane retardation at a wavelength of 550 nm was 40 nm. It was confirmed that the average tilt angle of the disc plane of the disk-like liquid crystal compound with respect to the film surface was 90°, and the disk-like liquid crystal compound was aligned vertically to the film surface. In addition, the angle of the slow axis of the optically anisotropic layer (4a') was orthogonal to the rotation axis of the rubbing roller, and assuming that the width direction of the film is defined as 0° (the longitudinal direction of the film is defined as 90° for counterclockwise and −90° for clockwise), the in-plane slow axis direction was 104° in a case of being viewed from the optically anisotropic layer (4a') side.

A laminate (4a'-4a-4b-4c) in which the optically anisotropic layer (4c), the optically anisotropic layer (4b), the optically anisotropic layer (4a), and the optically anisotropic layer (4a') were laminated on the elongated cellulose acylate film was prepared by the above procedure.

Preparation of Linearly Polarizing Plate

The surface of a support of a cellulose triacetate film TJ25 (manufactured by Fujifilm Corporation, thickness: 25 μm) was subjected to an alkali saponification treatment. Specifically, the support was immersed in a 1.5 N sodium hydroxide aqueous solution at 55° C. for 2 minutes, washed in a water washing bath at room temperature, and further neutralized with 0.1 N sulfuric acid at 30° C. After neutralization, the support was washed in the water washing bath at room temperature and further dried with hot air at 100° C. to obtain a polarizer protective film.

A roll-like polyvinyl alcohol (PVA) film having a thickness of 60 μm was continuously stretched in an iodine aqueous solution in a longitudinal direction and dried to obtain a polarizer having a thickness of 13 μm. The luminosity corrected single transmittance of the polarizer was 43%. At this time, the absorption axis direction and the longitudinal direction of the polarizer coincided.

The polarizer protective film was bonded to one surface of the polarizer using the following PVA adhesive to prepare a linearly polarizing plate.

(Preparation of PVA Adhesive)

100 parts by mass of a polyvinyl alcohol-based resin having an acetoacetyl group (average degree of polymerization: 1200, degree of saponification: 98.5 mol %, degree of acetoacetylation: 5 mol %) and 20 parts by mass of methylol melamine were dissolved in pure water under a temperature condition of 30° C. to prepare a PVA adhesive as an aqueous solution adjusted to a concentration of solid contents of 3.7% by mass.

Preparation of Circularly Polarizing Plate

The surface of the layer corresponding to the optically anisotropic layer X included in the elongated optical film prepared in each of Examples 1 to 4, that is, the optically anisotropic layer (1a), the optically anisotropic layer (2a), the optically anisotropic layer (3a') or the optically anisotropic layer (4a') and the surface of the polarizer (the surface opposite to the polarizer protective film) of the elongated linearly polarizing plate prepared above were continuously bonded to each other using an ultraviolet curable adhesive.

Subsequently, the cellulose acylate film and the photo-alignment film on the side of the layer corresponding to the optically anisotropic layer Z, that is, the optically anisotropic layer (1c), the optically anisotropic layer (2c), the optically anisotropic layer (3c) or the optically anisotropic layer (4c) were peeled off to expose the surface which was in contact with the cellulose acylate film of the optically anisotropic layer Z.

In this manner, circularly polarizing plates (P1 to P4) were prepared, which consisted of the optical film of each of Examples 1 to 4 and the linearly polarizing plate, and in which the polarizer protective film, the polarizer, the optically anisotropic layer X, the optically anisotropic layer Y, and the optically anisotropic layer Z were laminated in this order. At this time, the absorption axis of the polarizer was 90° with the width direction as a reference of 0°, which coincided with the longitudinal direction.

In the circularly polarizing plate (P1) including the optical film prepared in Example 1, the relationship between the absorption axis of the polarizer and the in-plane slow axis of each optically anisotropic layer was in the aspect described in FIG. 10 to FIG. 12 above.

In the circularly polarizing plate (P2) including the optical film prepared in Example 2, the relationship between the absorption axis of the polarizer and the in-plane slow axis of each optically anisotropic layer was in the aspect described in FIG. 14 to FIG. 16 above.

In the circularly polarizing plate (P3) including the optical film prepared in Example 3, the relationship between the absorption axis of the polarizer and the in-plane slow axis of each optically anisotropic layer was in the aspect described in FIG. 2 to FIG. 4 above.

In the circularly polarizing plate (P4) including the optical film prepared in Example 4, the relationship between the absorption axis of the polarizer and the in-plane slow axis of each optically anisotropic layer was in the aspect described in FIG. 6 to FIG. 8 above.

Comparative Example 1

An optical film in which an optically anisotropic layer (h1) consisting of vertically aligned disk-like liquid crystal compounds and an optically anisotropic layer (h2) consisting of twist-aligned disk-like liquid crystal compounds were directly laminated in this order on an elongated cellulose acylate film was prepared in the same manner as in the method described in Example 1 of JP5960743B.

At this time, the retardation of the optically anisotropic layer (h1) at a wavelength of 550 nm was 181 nm, and assuming that the width direction of the film is defined as 0° (the longitudinal direction of the film is defined as 90°), the slow axis was −13° in a case of being viewed from the optically anisotropic layer (h1) side. In addition, the Δnd of the optically anisotropic layer (h2) at a wavelength of 550 nm was 172 nm, the twisted angle of the liquid crystal compound was 81°, and assuming that the width direction of the film is defined as 0° (the longitudinal direction of the film is defined as 90°), the in-plane slow axis direction was −94° on the air side and −13° on the side in contact with the cellulose acylate film, in a case of being viewed from the optically anisotropic layer (h2) side.

The surface of the cellulose acylate film of the laminate (h1-h2) formed on the elongated cellulose acylate film prepared above, and the surface of the polarizer (the surface opposite to the polarizer protective film) of the elongated linearly polarizing plate prepared above were continuously bonded to each other using an ultraviolet curable adhesive. In this manner, a circularly polarizing plate (PH) was prepared.

Preparation of Organic EL Display Device (Mounting on Display Device)

The GALAXY S4 (manufactured by Samsung Electronics Co., Ltd.) equipped with an organic EL panel was disassembled, a circularly polarizing plate was peeled off, and the circularly polarizing plate prepared above was bonded to the display device using a pressure sensitive adhesive such that the polarizer protective film was disposed outside.

[Evaluation of Display Performance]

(Front Direction)

The prepared organic EL display device was brought into a black display state and observed from the front direction under bright light, and the tinting was evaluated according to the following standards. The results are shown in Table 1 which will be given later.

A: The tinting is not visible at all, or the shift in tint is visible, but only a little. (acceptable)
B: The tinting is visible, but the reflected light is small and there is no problem in use. (acceptable)
C: The tinting is visible and there is a lot of reflected light, which is unacceptable.

(Oblique Direction)

The prepared organic EL display device was brought into a black display state, a fluorescent lamp was projected from a polar angle of 45° under bright light, and the reflected light was observed from all directions. The azimuthal angle dependence of changes in tint was evaluated according to the following standards. The results are shown in Table 1 which will be given later.

A: The difference in tint is not visible at all, or the difference in tint is visible, but it is very slight. (acceptable)
B: The difference in tint is slightly visible, but within the acceptable range, the reflected light is small, and there is no problem in use. (acceptable)
C: The difference in tint is visible and there is a lot of reflected light, which is unacceptable.

TABLE 1

| | Optically anisotropic layer laminate | Liquid crystal shape | Liquid crystal alignment state | Evaluation of display performance | |
|---|---|---|---|---|---|
| | | | | Front direction | Oblique direction |
| Example 1 | X(1a) | Rod-like | Horizontally aligned | A | A |
| | Y(1b) | Disk-like | Twist-aligned | | |
| | Z(1c) | Rod-like | Twist-aligned | | |

TABLE 1-continued

| | Optically anisotropic layer laminate | Liquid crystal shape | Liquid crystal alignment state | Evaluation of display performance | |
|---|---|---|---|---|---|
| | | | | Front direction | Oblique direction |
| Example 2 | X(2a) | Disk-like | Vertically aligned | A | A |
| | Y(2b) | Rod-like | Twist-aligned | | |
| | Z(2c) | Disk-like | Twist-aligned | | |
| Example 3 | X(3a') | Rod-like | Horizontally aligned | A | A |
| | X(3a) | Disk-like | Vertically aligned | | |
| | Y(3b) | Rod-like | Twist-aligned | | |
| | Z(3c) | Disk-like | Twist-aligned | | |
| Example 4 | X(4a') | Disk-like | Vertically aligned | A | A |
| | X(4a) | Rod-like | Horizontally aligned | | |
| | Y(4b) | Disk-like | Twist-aligned | | |
| | Z(4c) | Rod-like | Twist-aligned | | |
| Comparative Example 1 | (h1) | Disk-like | Vertically aligned | A | C |
| | (h2) | Disk-like | Twist-aligned | | |

From the results shown in Table 1 above, it was confirmed that the optical film of the present invention was capable of suppressing the black tinting in a front direction and an oblique direction in a case where the optical film was used as a circularly polarizing plate in an organic EL display device. On the other hand, the optical film of Comparative Example was inferior in suppression of the black tinting in an oblique direction in a case where the optical film was used as a circularly polarizing plate in an organic EL display device.

EXPLANATION OF REFERENCES 10A, 10B, 10C, 10D: phase difference film
12A, 12B, 12C, 12D: first optically anisotropic layer
14A, 14B, 14C, 14D: second optically anisotropic layer
16A, 16B, 16C, 16D: third optically anisotropic layer
18A, 18B: fourth optically anisotropic layer
20: polarizer
100A, 100B, 100C, 100D: circularly polarizing plate

What is claimed is:

1. A phase difference film comprising, in the following order:
an optically anisotropic layer X;
an optically anisotropic layer Y; and
an optically anisotropic layer Z,
wherein the optically anisotropic layer X is an A-plate,
the optically anisotropic layer Y is a layer formed by fixing a first liquid crystal compound twist-aligned along a helical axis extending in a thickness direction,
the optically anisotropic layer Z is a layer formed by fixing a second liquid crystal compound twist-aligned along a helical axis extending in a thickness direction,
one of the first liquid crystal compound and the second liquid crystal compound is a rod-like liquid crystal compound, and the other of the first liquid crystal compound and the second liquid crystal compound is a disk-like liquid crystal compound, and
an in-plane slow axis of the optically anisotropic layer X is parallel to an in-plane slow axis on a surface of the optically anisotropic layer Y on an optically anisotropic layer X side.

2. The phase difference film according to claim 1,
wherein the optically anisotropic layer X includes a positive A-plate and a negative A-plate,
in a case where the positive A-plate and the negative A-plate are disposed in this order from a surface of the optically anisotropic layer X opposite to an optically anisotropic layer Y side, the first liquid crystal compound is a rod-like liquid crystal compound, and the second liquid crystal compound is a disk-like liquid crystal compound, and
in a case where the negative A-plate and the positive A-plate are disposed in this order from the surface of the optically anisotropic layer X opposite to the optically anisotropic layer Y side, the first liquid crystal compound is a disk-like liquid crystal compound, and the second liquid crystal compound is a rod-like liquid crystal compound.

3. The phase difference film according to claim 2,
wherein an in-plane retardation at a wavelength of 550 nm of the A-plate on the side of the optically anisotropic layer X opposite to the optically anisotropic layer Y side is 20 to 90 nm, and
an in-plane retardation at a wavelength of 550 nm of the A plate of the optically anisotropic layer X on the optically anisotropic layer Y side is 70 to 200 nm.

4. The phase difference film according to claim 2,
wherein a twisted angle of the first liquid crystal compound is within a range of 40°±20°.

5. The phase difference film according to claim 2,
wherein a twisted angle of the second liquid crystal compound is within a range of 40°±20°.

6. The phase difference film according to claim 2,
wherein a value of a product Δnd of a refractive index anisotropy Δn of the optically anisotropic layer Y at a wavelength of 550 nm and a thickness d of the optically anisotropic layer Y is 50 to 120 nm.

7. The phase difference film according to claim 2,
wherein a value of a product Δnd of a refractive index anisotropy Δn of the optically anisotropic layer Z at a wavelength of 550 nm and a thickness d of the optically anisotropic layer Z is 50 to 120 nm.

8. A circularly polarizing plate comprising:
a polarizer; and
the phase difference film according to claim 2.

9. A display device comprising:
the phase difference film according to claim 2.

10. The phase difference film according to claim 1,
wherein the optically anisotropic layer X is a positive A-plate or a negative A-plate,
in a case where the optically anisotropic layer X is a positive A-plate, the first liquid crystal compound is a disk-like liquid crystal compound, and the second liquid crystal compound is a rod-like liquid crystal compound, and
in a case where the optically anisotropic layer X is a negative A-plate, the first liquid crystal compound is a rod-like liquid crystal compound, and the second liquid crystal compound is a disk-like liquid crystal compound.

11. The phase difference film according to claim 10,
wherein an in-plane retardation of the optically anisotropic layer X at a wavelength of 550 nm is 120 to 240 nm.

12. The phase difference film according to claim 10,
wherein a twisted angle of the first liquid crystal compound is 80°±30°.

13. The phase difference film according to claim 10, wherein a twisted angle of the second liquid crystal compound is 175°±30°.

14. The phase difference film according to claim 10, wherein a value of a product $\Delta nd$ of a refractive index anisotropy $\Delta n$ of the optically anisotropic layer Y at a wavelength of 550 nm and a thickness d of the optically anisotropic layer Y is 120 to 240 nm.

15. The phase difference film according to claim 10, wherein a value of a product $\Delta nd$ of a refractive index anisotropy $\Delta n$ of the optically anisotropic layer Z at a wavelength of 550 nm and a thickness d of the optically anisotropic layer Z is 70 to 190 nm.

16. A circularly polarizing plate comprising:
a polarizer; and
the phase difference film according to claim 1.

17. A display device comprising:
the phase difference film according to claim 1.

* * * * *